US012692172B2

(12) United States Patent
Walker et al.

(10) Patent No.: US 12,692,172 B2
(45) Date of Patent: Jul. 28, 2026

(54) HIGH PURITY CORDIERITE MATERIAL FOR SEMICONDUCTOR APPLICATIONS

(71) Applicant: Heraeus Covantics North America LLC, Chandler, AZ (US)

(72) Inventors: Luke Walker, Chandler, AZ (US); Saurav Bista, Chandler, AZ (US); Matthew Joseph Donelon, Chandler, AZ (US); Steven Roger Kennedy, Chandler, AZ (US)

(73) Assignee: Heraeus Covantics North America LLC, Chandler, AZ (US)

( * ) Notice: Subject to any disclaimer, the term of this patent is extended or adjusted under 35 U.S.C. 154(b) by 934 days.

(21) Appl. No.: 17/759,163

(22) PCT Filed: Jan. 26, 2021

(86) PCT No.: PCT/US2021/015066
§ 371 (c)(1),
(2) Date: Jul. 20, 2022

(87) PCT Pub. No.: WO2021/154713
PCT Pub. Date: Aug. 5, 2021

(65) Prior Publication Data
US 2023/0137894 A1 May 4, 2023

Related U.S. Application Data

(60) Provisional application No. 62/966,468, filed on Jan. 27, 2020.

(51) Int. Cl.
*C01F 7/02* (2022.01)
*C04B 35/117* (2006.01)
*G03F 1/22* (2012.01)

(52) U.S. Cl.
CPC .............. *C01F 7/02* (2013.01); *C04B 35/117* (2013.01); *G03F 1/22* (2013.01); *C01P 2002/74* (2013.01);
(Continued)

(58) Field of Classification Search
CPC .............. C01P 2006/16; C01P 2006/80; C04B 2235/3206; C04B 2235/3217;
(Continued)

(56) References Cited

U.S. PATENT DOCUMENTS 6,319,870 B1 11/2001 Beall et al.
6,773,657 B2 8/2004 Beall et al.
(Continued)

FOREIGN PATENT DOCUMENTS

CN 1329581 A 1/2002
CN 1355776 A 6/2002
(Continued)

*Primary Examiner* — Laura A Auer
(74) *Attorney, Agent, or Firm* — Dicke, Billig & Czaja, PLLC

(57) ABSTRACT

Disclosed is a cordierite sintered body comprising from 90 to 98% by volume of a cordierite crystal phase as measured using x ray diffraction, SEM and image processing methods wherein the cordierite sintered body has at least one surface comprising pores having a diameter of from 0.1 to 5 um as measured using SEM and image processing methods. The cordierite sintered body has a Young's modulus of about 125 GPa or greater, and volumetric porosity of less than about 4%. Methods of making the cordierite sintered body are also disclosed.

18 Claims, 17 Drawing Sheets

A)

B)

(52) U.S. Cl.
CPC ...... *C01P 2004/02* (2013.01); *C01P 2004/03* (2013.01); *C01P 2006/16* (2013.01); *C01P 2006/80* (2013.01); *C04B 2235/3206* (2013.01); *C04B 2235/3217* (2013.01); *C04B 2235/3418* (2013.01)

(58) Field of Classification Search
CPC ........ C04B 2235/5409; C04B 2235/77; C04B 2235/80; C04B 2235/06; C04B 2235/963; C04B 35/195

See application file for complete search history.

(56) References Cited

U.S. PATENT DOCUMENTS

| | | | |
|---|---|---|---|
| 6,816,232 B2 | 11/2004 | Takahashi et al. | |
| 7,037,870 B2 | 5/2006 | Yamamoto et al. | |
| 8,530,029 B2 | 9/2013 | Lu et al. | |
| 8,736,810 B2 | 5/2014 | Wilklow | |
| 8,871,676 B2 | 10/2014 | Grohol et al. | |
| 9,771,303 B2 | 9/2017 | Isoda et al. | |
| 11,198,648 B2 | 12/2021 | Isoda et al. | |
| 2003/0181310 A1 | 9/2003 | Yamamoto et al. | |
| 2004/0083966 A1 | 5/2004 | Takahashi et al. | |
| 2005/0215417 A1 | 9/2005 | Teratani et al. | |
| 2011/0116068 A1 | 5/2011 | Wilklow et al. | |
| 2013/0095994 A1* | 4/2013 | Kawahara ........... C04B 35/6455 501/153 | |
| 2013/0225392 A1 | 8/2013 | Iida et al. | |
| 2016/0264471 A1 | 9/2016 | Isoda et al. | |
| 2017/0275207 A1 | 9/2017 | Isoda et al. | |
| 2018/0111880 A1 | 4/2018 | Backhaus-Ricoult et al. | |

FOREIGN PATENT DOCUMENTS

| | | | |
|---|---|---|---|
| CN | 1480986 A | 3/2004 | |
| CN | 102159518 A | 8/2011 | |
| CN | 102272071 A | 12/2011 | |
| CN | 105764871 A | 7/2016 | |
| CN | 107226692 A | 10/2017 | |
| EP | 1338580 A1 | 8/2003 | |
| EP | 2581354 A1 | 4/2013 | |
| JP | H10194828 | 7/1998 | |
| JP | H11-209171 A | 8/1999 | |
| JP | 2002179459 A | 6/2002 | |
| JP | 2003321271 | 11/2003 | |
| JP | 2004256346 | 9/2004 | |
| JP | 2005179137 | 7/2005 | |
| JP | 2014073928 | 4/2014 | |
| TW | 201609601 A | 3/2016 | |
| WO | 2010020337 A1 | 2/2010 | |

* cited by examiner

HIGH PURITY CORDIERITE MATERIAL FOR SEMICONDUCTOR APPLICATIONS

TECHNICAL FIELD

The disclosure relates to ceramics having low thermal expansion comprising a substantially phase pure cordierite sintered body. More specifically, the disclosure relates to cordierite sintered bodies having low thermal expansion adapted for use in devices for semiconductor processing such as a chuck, a stage of an exposure apparatus, a support member for optical elements of a lithography apparatus, and a photolithographic patterning reticle for semiconductor manufacturing having a layer comprising the cordierite sintered body.

BACKGROUND

With increasing miniaturization in semiconductor manufacture, materials having extremely low thermal expansion are required for satisfactory positioning accuracy in the microlithographic processes used for this purpose. Thus, accuracies in the region of 0.1 nm are required in the positioning of the wafers so that a coefficient of thermal expansion of <0.5 ppm/K (i.e., $<0.5 \times 10^{-6}$/K), preferably <0.05 ppm/K, preferably <0.005 ppm/K, is required in order to avoid incorrect positioning due to small temperature fluctuations. The materials used in the microlithographic processes should at the same time have a high Young's modulus in order to prevent vibration and ensure the mechanical stability of the components and a high thermal conductivity to dissipate heat and temperature variations during processing.

For components used here, e.g., substrate holders (known as wafer stages), reticles and optical support members, either low-expansion glass-ceramics based on $Li_2O$—$Al_2O_3$—$SiO_2$ (LAS) glass-ceramics (e.g., Zerodur®) or sintered ceramics which are frequently based on cordierite are used nowadays. Glass-ceramics from the LAS system, in which lithium-high-quartz solid solutions form a main crystal phase, can be produced with a particularly low coefficient of thermal expansion of less than 0.02 ppm/K (in the temperature range 0-50° C.). A further advantage is that, as a result of the production method, they have no measurable porosity. However, their Young's modulus is generally only in the range from 90 to 95 GPa, which is too low for many applications. Further, these low-expansion glass ceramics have low thermal conductivity.

Cordierite-containing ceramics, as are described, for example, in the US patent application US 2013/0225392, likewise have coefficients of thermal expansion in the range of <0.1 ppm/K in a narrow temperature range of 20-25° C. However, such ceramics are porous as a result of the production method and are characterized by a Young's modulus as low as 70 GPa. This porosity results in the formation of defects or holes upon polishing which render the surface unsuitable for deposition of reflective materials to form a reflective reticle having very low surface roughness for use in lithographic applications, as well as lowered thermal conductivity, creating thermal variations during semiconductor processing and strengths too low for some applications. Such ceramics also frequently contain additives such as dopants and/or sintering aids and other phases than the cordierite crystalline phase. The presence of these additives and other phases than cordierite may result in greater variances in coefficient of thermal expansion (CTE) with temperature and decreased thermal conductivity, reducing exposure precision when used as a reflective reticle in lithographic applications, as well as reduced corrosion and erosion resistance when used within semiconductor plasma processing chambers.

The electronics industry recognizes the beneficial thermal properties of cordierite material when used as a substrate and has compensated for its detrimental porosity. For example, U.S. Pat. No. 8,736,810 provides a reflective reticle that substantially reduces or eliminates pattern distortion resulting from the absorption of EUV energy, wherein the reticle includes a layer of ultra-low expansion glass located over a substrate of cordierite to compensate for the porous surface. This, however, adds material and process costs to the reflective reticle and its manufacture. Moreover, a layer of glass also reduces the thermal conductivity of the reticle and thereby increases the thermal gradient which can lead to pattern distortion.

Accordingly, there is a need in the art for a cordierite material that has a coefficient of thermal expansion (CTE) that is substantially zero across a temperature range of operation having a Young's Modulus of substantially greater than 130 GPa and essentially free of pores providing high thermal conductivity and the ability to be polished to a low surface roughness that can be used, for example, as a wafer support such as a vacuum or electrostatic chuck, a member for supporting and positioning optical elements, and a substrate adapted for use as part of a reflective reticle for a semiconductor manufacturing apparatus.

SUMMARY

These and other needs are addressed by the various embodiments, aspects and configurations as disclosed herein:

In one aspect there is provided a cordierite sintered body comprising cordierite ($Mg_2Al_4Si_5O_{18}$) and having at least one surface, wherein the cordierite sintered body has a density of from 2.55 to 2.63 g/cc.

In another aspect there is provided a method of making a cordierite sintered body, the method comprising the steps of: a) combining powders comprising silicon dioxide ($SiO_2$), magnesium oxide (MgO) and aluminum oxide ($Al_2O_3$) to form a powder mixture; b) calcining the powder mixture by applying heat to raise the temperature of the powder mixture to a calcination temperature and maintaining the calcination temperature to perform calcination to produce a calcined powder mixture; c) disposing the calcined powder mixture inside a volume defined by a tool set of a sintering apparatus and creating vacuum conditions inside the volume; d) applying pressure to the calcined powder mixture while heating to a sintering temperature and performing sintering to form the cordierite sintered body, wherein the cordierite sintered body comprises $Mg_2Al_4Si_5O_{18}$; and e) lowering the temperature of the cordierite sintered body.

In another aspect there is provided a photolithographic reticle comprising at least one layer of a cordierite sintered body comprising $Mg_2Al_4Si_5O_{18}$ and having at least one surface, wherein the cordierite sintered body has a density of between 2.55 and 2.63 g/cc.

In a further aspect there is provided a support chuck comprising at least one layer of a cordierite sintered body comprising $Mg_2Al_4Si_5O_{18}$ and having at least one surface, wherein the cordierite sintered body has a density of between 2.55 and 2.63 g/cc.

In a yet further aspect, there is provided a support structure comprising at least one layer of a cordierite sintered body comprising $Mg_2Al_4Si_5O_{18}$ and having at least one surface, wherein the cordierite sintered body has a density of between 2.55 and 2.63 g/cc.

In yet another aspect, there is provided a cordierite sintered body produced by a method comprising the steps of: a) combining powders comprising silicon dioxide ($SiO_2$), magnesium oxide (MgO) and aluminum oxide ($Al_2O_3$) to form a powder mixture; b) calcining the powder mixture by applying heat to raise the temperature of the powder mixture to a calcination temperature and maintaining the calcination temperature to perform calcination to produce a calcined powder mixture; c) disposing the calcined powder mixture inside a volume defined by a tool set of a sintering apparatus and creating vacuum conditions inside the volume; d) applying pressure to the calcined powder mixture while heating to a sintering temperature and performing sintering to form the cordierite sintered body, wherein the cordierite sintered body comprises $Mg_2Al_4Si_5O_{18}$; and e) lowering the temperature of the cordierite sintered body.

Embodiment 1. A cordierite sintered body comprising: from 90 to 98% by volume of a cordierite crystal phase as measured using x ray diffraction, SEM and image processing methods wherein the cordierite sintered body has at least one surface comprising pores having a diameter of from 0.1 to 5 um as measured using SEM and image processing methods.

Embodiment 2. The cordierite sintered body of claim 1 wherein the cordierite sintered body comprises the cordierite crystal phase in an amount by volume of 90% and more, preferably 95% and more, preferably from 90 to 97%, preferably from 93 to 98%, preferably from 95 to 98%, preferably from 90 to 95%, preferably from 93 to 97%.

Embodiment 3. The cordierite sintered body of any one of embodiments 1 or 2 wherein the at least one surface comprises pores having a diameter of from 0.1 to 4 um, preferably from 0.1 to 3 um, preferably from 0.1 to 2 um, preferably from 0.1 to 1 um.

Embodiment 4. The cordierite sintered body of any one of the preceding embodiments 1 to 3 having a density of from 2.55 to 2.63 g/cc, preferably from 2.58 to 2.63 g/cc, preferably from 2.61 to 2.63 g/cc, preferably from 2.62 to 2.63 g/cc, as measured in accordance with ASTM B962-17.

Embodiment 5. The cordierite sintered body of any one of the preceding embodiments 1 to 4 having a volumetric porosity of from 0.1 to 4%, preferably from 0.1 to 3%, preferably from 0.1 to 2%, preferably from 0.1 to 1%, preferably from 0.1 to 0.5%, preferably from 0.5 to 4%, preferably from 0.5 to 3%, preferably from 1 to 4%, preferably from 1 to 3%, preferably from 1 to 2%, preferably from 1.5 to 3.5% as calculated from density measurements performed in accordance with ASTM B962-17.

Embodiment 6. The cordierite sintered body of any one of the preceding embodiments 1 to 5 having a Young's modulus of from 125 to 180 GPa, preferably from 125 to 160 GPa, preferably from 125 to 140 GPa, preferably from 130 to 180 GPa, preferably from 130 to 160 GPa, preferably from 130 to 150 GPa, as measured in accordance with ASTM E1876-15.

Embodiment 7. The cordierite sintered body of any one of the preceding embodiments 1 to 6 wherein the cordierite sintered body is substantially free of a glassy phase as determined by x ray diffraction.

Embodiment 8. The cordierite sintered body of any one of the preceding embodiments 1 to 7 wherein the cordierite sintered body is substantially crystalline as determined by x ray diffraction.

Embodiment 9. The cordierite sintered body of any one of the preceding embodiments 1 to 8 having an arithmetical mean height (Sa) of 75 nm and less, preferably 50 nm and less, preferably 25 nm and less, preferably 15 nm and less, preferably 10 nm and less, preferably from 2 to 15 nm, preferably from 2 to 10 nm, preferably from 2 to 8 nm, preferably from 2 to 5 nm on a surface as measured in accordance with ISO standard 25178-2-2012.

Embodiment 10. The cordierite sintered body of any one of the preceding embodiments 1 to 9 having a maximum height (Sz) of less than 5.5 μm, preferably less than 4.0 μm, preferably less than 3.0 μm, preferably less than 2.0 μm, preferably less than 1.5 μm, preferably less than 1 μm, preferably from 0.3 to 3 um, preferably from 0.3 to 2 um, preferably from 0.3 to 1 um, according to ISO standard 25178-2-2012.

Embodiment 11. The cordierite sintered body of any one of the preceding embodiments 1 to 10 wherein the at least one surface of the cordierite sintered body comprises porosity in an amount of less than 1%, preferably less than 0.9%, preferably less than 0.8%, preferably less than 0.6%, preferably less than 0.3%, preferably less than 0.1%, preferably about 0.05% with respect to the total area of the at least one surface as measured using SEM and ImageJ methods.

Embodiment 12. The cordierite sintered body of any one of the preceding embodiments 1 to 11 wherein the cordierite sintered body is free of sintering aids.

Embodiment 13. The cordierite sintered body of any one of the preceding embodiments 1 to 12 wherein the cordierite sintered body is free of dopants.

Embodiment 14. The cordierite sintered body of any one of the preceding embodiments 1 to 13 having a purity of from 99.9 to 99.995%, preferably from 99.95 to 99.995% relative to 100% purity of the cordierite sintered body as measured using ICPMS methods.

Embodiment 15. The cordierite sintered body of any one of the preceding embodiments 1 to 14 wherein the cordierite sintered body comprises the cordierite crystal phase in an amount by volume of from about 95% to about 98% and the sapphirine crystal phase in an amount of from about 2% to about 5% measured using x ray diffraction, SEM and image processing methods.

Embodiment 16. A method of making a cordierite sintered body, the method comprising the steps of:
   a) combining powders comprising silicon dioxide ($SiO_2$), magnesium oxide (MgO) and aluminum oxide ($Al_2O_3$) to make a powder mixture;
   b) calcining the powder mixture by applying heat to reach a calcination temperature and maintaining the calcination temperature to perform calcination to produce a calcined powder mixture;
   c) disposing the calcined powder mixture inside a volume defined by a tool set of a sintering apparatus and creating vacuum conditions inside the volume;
   d) applying pressure to the calcined powder mixture while heating to a sintering temperature and performing sintering to form the cordierite sintered body; and
   e) lowering the temperature of the cordierite sintered body.

Embodiment 17. The method of claim 16, further comprising the steps of:
   f. optionally annealing the cordierite sintered body by applying heat to raise the temperature of the cordierite sintered body to reach an annealing temperature, performing annealing; and
   g. lowering the temperature of the annealed cordierite sintered body.

Embodiment 18. The method of any one of embodiments 16 or 17, further comprising the step of:

h. machining the cordierite sintered body to create a cordierite sintered component such as a photolithographic reticle, support members for optical elements, a vacuum chuck, an electrostatic chuck, a support chuck, a reticle chuck for use in microlithography processes.

Embodiment 19. The method as in any one of embodiments 16 to 18 wherein the pressure is from 5 MPa to 100 MPa, preferably from 5 MPa to 60 MPa, preferably from 5 MPa to less than 50 MPa, preferably from 5 MPa to 40 MPa, preferably from 5 MPa to 20 MPa, preferably from 10 MPa to 60 MPa, preferably from 10 MPa to 50 MPa, preferably from 10 to 40 MPa, preferably from 10 to 30 MPa, preferably from 10 to 20 MPa, preferably from 15 to 45 MPa, preferably from 15 MPa to 30 MPa, preferably from 20 to 40 MPa.

Embodiment 20. The method as in any one of embodiments 16 to 19, wherein the sintering temperature is from 800 to 1300° C., preferably from 800 to 1250° C., preferably from 900 to 1300° C., preferably from 900 to 1250° C., preferably from 900 to 1200° C., preferably from 900 to 1100° C., preferably from 1000 to 1300° C., preferably from 1100 to 1300° C., preferably from 1100 to 1250° C.

Embodiment 21. The method as in any one of embodiments 16 to 20 wherein the calcined powder mixture has a purity of higher than 99.95% as measured using ICPMS methods.

Embodiment 22. The method as in any one of embodiments 16 to 21 wherein the calcined powder mixture has a specific surface area of from 8 to 20 m²/g, preferably from 10 to 20 m²/g, preferably from 12 to 20 m²/g, preferably from 14 to 20 m²/g, preferably from 16 to 20 m²/g, preferably from 8 to 18 m²/g, preferably from 8 to 16 m²/g, preferably from 8 to 14 m²/g, preferably from 10 to 20 m²/g, preferably from 14 to 20 m²/g, preferably from 16 to 20 m²/g, as measured using BET surface area analysis methods as measured according to ASTM C1274.

Embodiment 23. A photolithographic reticle comprising at least one layer of a cordierite sintered body according to any one of embodiments 1 to 15.

Embodiment 24. A support structure comprising at least one layer of a cordierite sintered body according to any one of embodiments 1 to 15.

Embodiment 25. A support chuck comprising at least one layer of a cordierite sintered body according to any one of embodiments 1 to 15.

Embodiment 26. A cordierite sintered body produced by the method of any one of embodiments 16 to 22 wherein the powders are free of naturally occurring materials comprising talc, kaolin, gibsite, dolomite, sepiolite, forsterite, and other clays and clay-based compounds.

Embodiment 27. The cordierite sintered body of embodiment 26 wherein each of the powders, powder mixture and calcined powder mixture are free of naturally occurring materials comprising talc, kaolin, gibsite, dolomite, sepiolite, forsterite, and other clays and clay-based compounds.

Embodiment 28. The cordierite sintered body of any one of embodiments 26 to 27 wherein the cordierite sintered body is free of naturally occurring materials comprising talc, kaolin, gibsite, dolomite, sepiolite, forsterite, and other clays and clay-based compounds.

Embodiment 29. The cordierite sintered body of any one of embodiments 26 to 28 wherein each of the powders, powder mixture and calcined powder mixture are substantially free of glass forming constituents comprising alkali metal elements including lithium (Li), sodium (Na) and potassium (K), alkaline earth metal elements including calcium (Ca), strontium (Sr) and barium (Ba), transition metals including chromium (Cr), nickel (Ni), iron (Fe), copper (Cu), zinc (Zn), lead (Pb), rubidium (Rb) and metalloid elements including boron (B), germanium (Ge), arsenic (As), antimony (Sb) and bismuth (Bi).

Embodiment 30. The cordierite sintered body of any one of embodiments 26 to 29 wherein the cordierite sintered body is free of glass forming constituents comprising alkali metal elements including lithium (Li), sodium (Na) and potassium (K), alkaline earth metal elements including calcium (Ca), strontium (Sr) and barium (Ba), transition metals including chromium (Cr), nickel (Ni), iron (Fe), copper (Cu), zinc (Zn), lead (Pb), rubidium (Rb) and metalloid elements including boron (B), germanium (Ge), arsenic (As), antimony (Sb) and bismuth (Bi).

DETAILED DESCRIPTION

Figure 1:
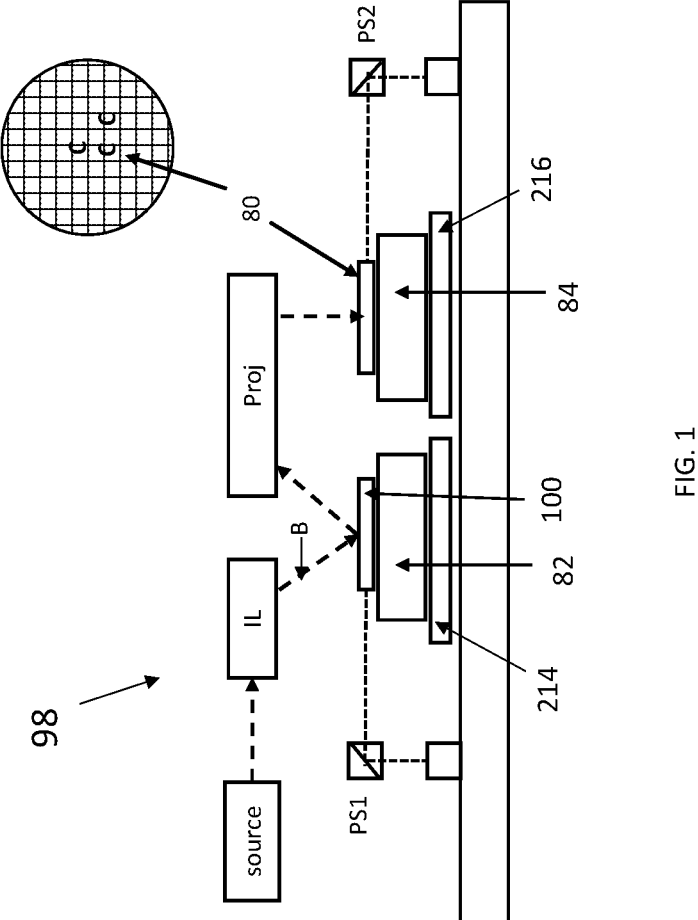
FIG. 1 depicts a reflective lithographic apparatus.

Reference will now be made in detail to specific embodiments. Examples of the specific embodiments are illustrated in the accompanying drawings. While the disclosure will be described in conjunction with these specific implementations, it will be understood that it is not intended to limit the disclosure to such specific embodiments. On the contrary, it is intended to cover alternatives, modifications, and equivalents as may be included within the spirit and scope as defined by the appended claims. In the following description, numerous specific details are set forth in order to provide a thorough understanding of the disclosed embodiments. The disclosure may be practiced without some of, or all of, these specific details.

Embodiments are disclosed, including the best mode known to the inventors for carrying out the invention. Variations of those embodiments may become apparent to those of ordinary skill in the art upon reading the following detailed description. The inventors expect skilled artisans to employ such variations as appropriate, and the inventors intend for the invention to be practiced otherwise than as specifically described. Accordingly, this invention includes all modifications and equivalents of the subject matter recited in the appended claims as permitted by applicable law. Moreover, any combination of the above-disclosed elements in all possible variations is encompassed by the invention unless otherwise indicated or otherwise clearly contradicted by context. Further, all features disclosed with respect to the method of making a cordierite sintered body also apply to the product, a cordierite sintered body, and all features disclosed with respect to the product, a cordierite sintered body, also apply to the method of making a cordierite sintered body.

All references, including publications, patent applications, and patents, cited are hereby incorporated by reference to the same extent as if each reference were individually and specifically indicated to be incorporated by reference and were set forth in its entirety.

Definitions

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to") unless otherwise noted. Recitation of ranges of values is merely intended to serve as a shorthand way to refer individually to each separate value falling within the range, unless otherwise indicated, and each separate value is incorporated into the specification as if it were individually recited. All methods described can be performed in any suitable order unless otherwise indicated or otherwise clearly contradicted by context. The use of any and all examples or exemplary language (e.g., "such as") is intended merely to better illuminate the invention and does not pose a limitation on the scope of the invention unless otherwise claimed. No language in the specification should be construed as indicating any non-claimed element as essential to the practice of the invention. The use of the term "comprising" in the specification and the claims include the narrower language of "consisting essentially of" and "consisting of".

As used herein, the term "EUV photolithography" refers to extreme UV lithography, which is used to manufacture articles such as, for example, integrated circuits.

As used herein, the term "EUV photomask substrate" or "substrate" is a multi-layer film stack. The films are typically deposited on a special 6"×6" substrate that has ULE/LTEM characteristics. An EUV photomask is a patterned reflective mask used for EUV photolithography.

The terms "photomask" and "reticle" may be used interchangeably.

As used herein, the terms "semiconductor wafer," "wafer," "substrate," and "wafer substrate," are used interchangeable. A wafer or substrate used in the semiconductor device industry typically has a diameter of 200 mm, or 300 mm, or 450 mm.

As used herein, the term "cordierite sintered body" is synonymous with "sinter", "body" or "sintered body" and refers to a solid ceramic article comprising cordierite and formed from the powder mixture disclosed herein upon being subjected to a pressure and heat treatment process which creates a cordierite body from the powder mixture. In embodiments, the term "cordierite sintered body" may refer to an integral body. By "integral" is meant a single piece or a single unitary part that is complete by itself without additional pieces, i.e., the part is of one monolithic piece formed as a unit with another part.

As used herein, the term "purity" refers to the absence of various contaminants and/or impurities in a) a starting material from which a powder mixture may be formed, b) a powder mixture after processing and calcination, and c) a cordierite sintered body as disclosed herein and is expressed as a percent of the total mass. Higher purity, approaching 100%, represents a material having essentially no contaminants or impurities, comprising only the intended material composition of Mg, Al, Si and O and optionally dopants and/or sintering aids.

As used herein, the term "impurity" refers to those compounds/contaminants present in a) the starting materials from which a powder mixture may be formed, b) a powder mixture and/or a calcined powder mixture after processing, and c) a cordierite sintered body, comprising impurities other than the starting materials themselves, which comprise Mg, Al, Si and O, and optionally dopants and/or sintering aids. Impurities may be present in the starting powder materials, powder mixtures and/or calcined powder mixtures after processing/combining, or during sintering, and present in the cordierite sintered body, and are reported as ppm where lower ppm levels correspond to lower impurity content.

Conversion of purity in percent to impurity in ppm is known to those skilled in the art where 1% reduction in purity=10,000 ppm in impurities.

The term "dopants" as used herein does not include the starting materials of magnesium oxide, silicon dioxide and aluminum oxide to the extent they may remain in the cordierite sintered body. Impurities differ from dopants in that dopants as defined herein are those compounds intentionally added to the starting powders or to the powder mixture to achieve certain electrical, mechanical, optical or other properties such as grain size modification and phase purity for example, in the cordierite sintered body.

The term "sintering aid" as used herein refers to additives, such as zirconia or calcia, that enhance densification, and thereby reduce porosity, during the sintering process.

As used herein, the term "tool set" may comprise a die and two punches and optionally additional spacer elements.

The term "phase" as used herein is understood to mean a crystalline region having a specific crystal structure.

As used herein, the term "stiffness" is synonymous and consistent with the definition of Young's modulus, as known to those skilled in the art.

The term "calcination" or "calcining" when used as relates to heat treatment processes is understood to mean heat treatment steps which may be conducted on a powder or a powder mixture in air to for example remove moisture and/or surface impurities, increase crystallinity and in some embodiments modify powder and/or powder mixture surface area.

The term "annealing" when applied to heat treatment of ceramics is understood herein to mean a heat treatment conducted on the disclosed cordierite sintered bodies in air to a temperature and allowed to cool slowly to relieve stress and/or normalize stoichiometry.

The term "Sa" as known in the art relates to the arithmetical mean height of a surface and represents the absolute value of the arithmetical mean across the surface and is commonly referred to as the "surface roughness". The definition according to ISO 25178-2-2012 section 4.1.7 is the arithmetic mean of the absolute of the ordinate values within a definition area (A) calculated according to the following equation:

$$S_a = \frac{1}{A} \int \int_A |z(x, y)| dx dy$$

The term "Sz" as known in the art refers to the maximum height, or "peak to valley" (of the scale-limited surface) and is defined as the sum of the maximum peak height value and the maximum pit height value within a definition area (A) as defined in ISO 25178-2-2012 section 4.1.6.

As used herein, the terms "substantially," "approximately," and "about" as they are used in connection with numbers allow for a variance of plus or minus 10%.

In the following description, given ranges include the lower and upper threshold values. Accordingly, a definition in the sense of "in the range of X to Y" or "in the range of from X to Y" of a parameter A means that A can be any value of X, Y and any value from X to Y. Definitions in the sense of "up to Y" or "at least X" of a parameter A means that accordingly A may be any value less than Y and Y, or A may be X and any value greater than X, respectively.

Cordierite Sintered Body

The following detailed description assumes the disclosure is implemented within equipment such as a lithographic apparatus and more specifically an EUV lithographic apparatus (such as is depicted in FIG. 1) to enable patterning of nanometer-scale features for etch and/or deposition processes which are necessary as part of the making of a semiconductor wafer. However, the disclosure is not so limited. The work piece may be of various shapes, sizes, and materials and combinations of materials. In addition to semiconductor wafer processing, other work pieces that may take advantage of this disclosure include various articles such as any lithography process where very fine scale resolution is beneficial, mirrors, supports for optical elements, wafer support structures such as stages or chucks, high precision and cryogenic lens holders, ultra-low expansion substrates for position control of a variety of lenses and mirrors, micro-mechanical devices and the like where precise control of position is needed across a temperature range of for example +/−100° C. from ambient temperatures.

Lithography is widely recognized as a key process in manufacturing integrated circuits (ICs) as well as other devices and/or structures. A lithographic apparatus is a machine (as depicted in FIG. 1 for a reflective lithographic apparatus), used during lithography, which applies a desired pattern onto a substrate semiconductor wafer, such as onto a target portion of a substrate wafer. During manufacture of ICs with a lithographic apparatus, a patterning device (which is alternatively referred to as a mask, reticle, photomask or a reflective reticle) 100 generates a circuit pattern to be formed on an individual layer in an IC. Examples of patterning devices 100 include reticles, masks, programmable mirror arrays, and programmable LCD panels. This pattern may be transferred onto the region (e.g., including part of, one, or several dies) C on the substrate (e.g., a silicon wafer), 80. Transfer of the pattern is typically via imaging onto a layer of radiation-sensitive material (e.g., resist) provided on the substrate. The term "patterning device" 100 should be broadly interpreted as referring to any device that may be used to impart a radiation beam B with a pattern in its cross-section, such as to create a pattern in the region C of the wafer 80. The pattern imparted to the radiation beam B may correspond to a particular functional layer in a device being created in the region C, such as an integrated circuit. In general, a single substrate contains a network of adjacent regions that are successively patterned. Manufacturing different layers of the IC often requires imaging different patterns on different layers with different reticles. Therefore, reticles must be changed during the lithographic process.

FIG. 1 depicts a reflective lithographic apparatus 98 which includes an illuminator (illumination system, "IL") configured to condition a radiation beam B (e.g., EUV radiation); a first support platform (e.g., a reticle or mask support) 82, configured to support a patterning device (e.g., a mask, a reticle, a photomask, a photolithographic reticle, a reflective reticle) 100 and connected to a first positioner 214 configured to accurately position the patterning device 100; and a second support platform (e.g., a wafer table, wafer chuck, wafer support) 84, configured to hold a substrate (e.g., a photoresist coated wafer) 80 and connected to a second positioner 216 configured to accurately position the wafer 80. Lithographic apparatus 98 also has a projection system (proj) configured to project a pattern imparted to the radiation beam B by patterning device 100 onto the wafer 80. In lithographic apparatus 98, the patterning device 100 and the projection system are reflective. Further referring to FIG. 1, the illuminator (IL) receives a radiation beam from a radiation source. The radiation beam B is incident on the patterning device (e.g., a mask, a photomask, a photolithographic reticle, a reflective reticle) 100, which is held on the first support platform (e.g., reticle support, mask support) 82, and is patterned by the patterning device 100. In lithographic apparatus 98, the radiation beam B is reflected from the patterning device (e.g., a mask, a reticle, a photomask, a photolithographic reticle, a reflective reticle) 100. After being reflected from the patterning device (e.g., mask) 100, the radiation beam B passes through the projection system (proj), which focuses the radiation beam B onto a region C of the wafer 80. With the aid of the second positioner 216 and position sensor PS2 (e.g., an interferometric device, linear encoder or capacitive sensor), the second support platform 84 may be moved accurately, e.g. so as to position different regions C in the path of the radiation beam B. Similarly, the first positioner 214 and another position sensor PS1 may be used to accurately position the patterning device (e. g., mask, reflective reticle, a photolithographic reticle) 100 with respect to the path of the radiation beam B.

Existing EUV lithographic apparatuses incorporate reflective reticles which have substrates typically formed from ultra-low expansion (ULE) glass, a glass-ceramic material having a coefficient of thermal expansion that is substantially zero across a wide range of operating temperatures. The selection of ULE glass as a substrate is typically based on the coefficient of thermal expansion of the ULE glass and on an ability to polish a surface of the ULE glass to the fine surface requirements necessary for EUV lithographic applications (i.e., surfaces that exhibit very low roughness, that are substantially free of defects, and that are substantially flat).

In general, existing reflective reticles for EUV lithographic apparatus typically exhibit a reflectance of approximately 70%. Therefore, depending on a pattern to be printed, an existing reflective reticle can absorb between approximately 30% and 100% of the energy of an incident EUV radiation beam. Such absorption can lead to significant heating of the reticle, which can distort or deform the reticle surface, despite the relatively low coefficient of thermal expansion of the ULE glass substrate and introduce errors in the projected image.

It is necessary that the precision during exposure on to the wafer 80 is high in order to form semiconductor devices at a very fine feature size, such as 9 nm and down to as low as for example 5 nm node dimensions. Such factors as thermal expansion and deformation of the patterning device 90 due to heat generated from absorbance of radiation, as well as vibration during use of $1^{st}$ and $2^{nd}$ support platforms 82 and 84, is problematic and deteriorates the exposure precision when patterning semiconductor devices onto a wafer.

To address these factors, the patterning device 100, first support platform 82 and second support platform 84 preferably comprise a cordierite sintered body as disclosed herein having high thermal conductivity, low coefficient of thermal expansion (not greater than 1 ppm/° C.) across a temperature range of from 0 to 50° C., and high young's modulus. In some embodiments, the cordierite sintered body may comprise an integral body. In other embodiments, the cordierite sintered body may comprise more than one cordierite sintered body which are joined using the methods as disclosed herein, to form a cordierite composite body.

Disclosed herein is a cordierite sintered body comprising from 90 to 98% by volume of a cordierite crystal phase as measured using x ray diffraction, SEM and image processing methods wherein the cordierite sintered body has at least one surface comprising pores having a diameter of from 0.1 to 5 um as measured using SEM and image processing methods. The cordierite sintered body is suitable for use as a material or as a material layer as a substrate in a reflective reticle, a photolithographic reticle, as a support member or structure or platform, a stage, a wafer chuck, a positioning element, and an electrostatic chuck for use in an EUV lithographic apparatus.

The cordierite sintered body is made as disclosed herein from a powder mixture comprising about 22.2 mol % MgO, about 22.2 mol % $Al_2O_3$ and about 55.6 mol % $SiO_2$, which is then sintered as disclosed herein to form a primary crystal phase comprising a cordierite crystal phase of composition $Mg_2Al_4Si_5O_{18}$. In other words, the cordierite crystal phase is the primary crystal phase of the material. According to embodiments, the primary crystal phase proportion of the cordierite crystal phase is 90% by volume or more, preferably the cordierite crystal phase is 93% by volume or more, preferably 95% by volume or more, preferably 98% by volume or more, preferably from 90 to 98%, preferably from 90 to 97%, preferably from 93 to 98%, preferably from 95 to 98%, preferably from 90 to 95%, preferably from 93 to 97%, most preferably about 98% by volume, where the crystal phase identification and proportions are determined by performing an X-ray diffraction measurement in the range of 2θ=8° to 85° using a PANanlytical Aeris model XRD capable of crystalline phase identification to +/−5% by volume, combined with SEM imaging and ImageJ image processing. The combination of XRD, SEM and image processing software may provide for the determination of phase purity to +/−0.1% by volume. All SEM images were obtained using a Nano Science Instruments scanning electron microscope (SEM) model Phenom XL equipped with an energy-dispersive spectroscopy (EDS) and a backscatter electron (BSD) detector which also has a topographic mode. SEM images combined with ImageJ image processing software as disclosed herein may allow for phase identification and feature measurement to about +/−0.1% by volume of the cordierite sintered body as disclosed herein. ImageJ has been developed at the National Institute of Health (NIH), USA, and is a Java-based public domain image processing and analysis program for image processing of scientific multi-dimensional images. SEM Images were taken at 1000× using BSD and topographic modes to identify the crystalline phases, and any porosity present.

Figure 8:
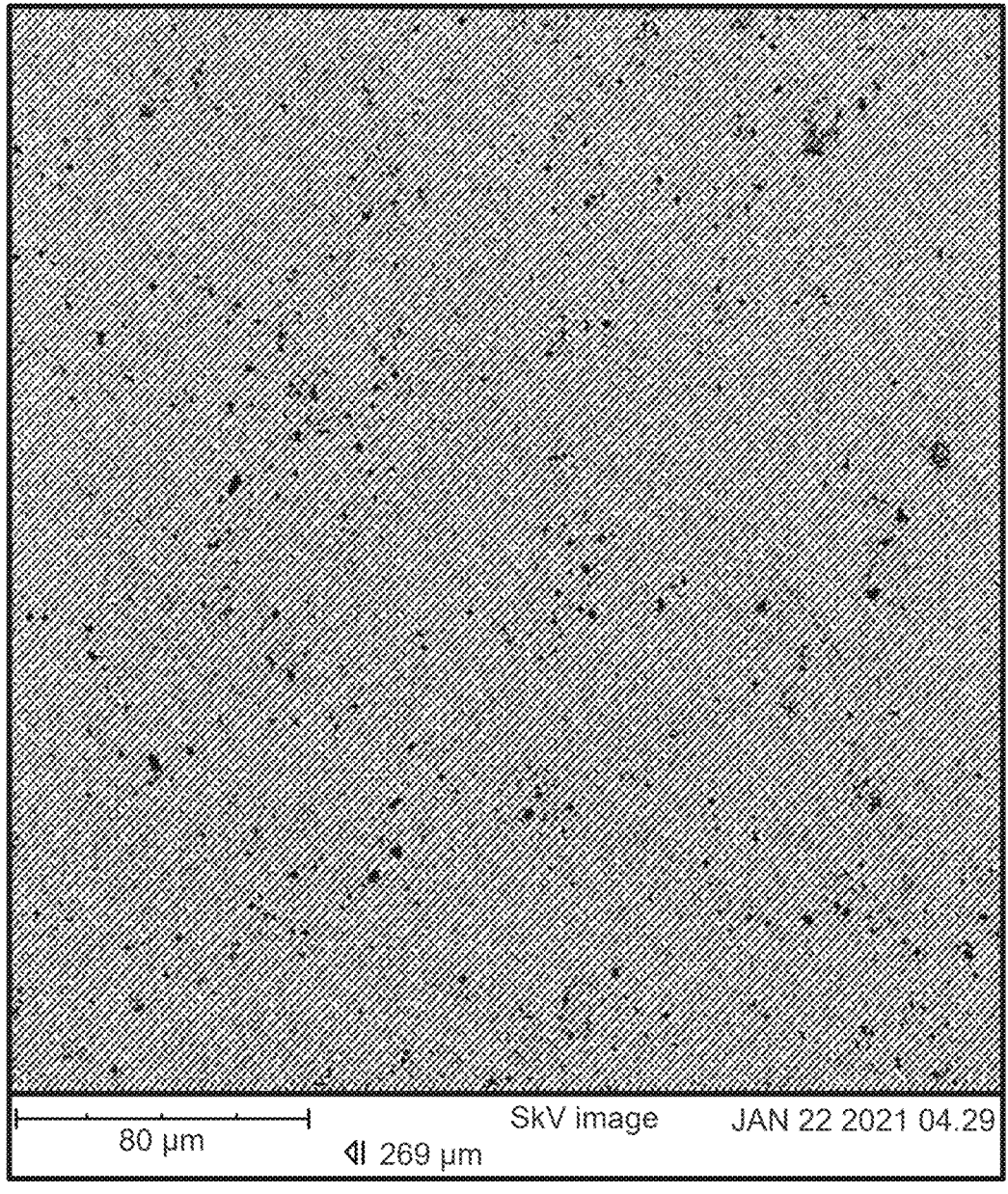
FIG. 8 illustrates an SEM micrograph at 1000× of a cordierite sintered body according to embodiments as disclosed herein.

In order to determine the phase purity to greater accuracy, for example up to and including about 98% accuracy, SEM images were taken using backscatter detection (BSD) methods as known to those skilled in the art. Using BSD, the cordierite phase appears light gray, aluminum oxide and/or alumina rich phases may appear black or dark gray, and porosity, if present, also appears black. Images were taken at 1000× using BSD methods as known to those skilled in the art to identify the crystalline phases and any porosity present as depicted in FIG. 8 (for sample 015). In order to differentiate between black regions comprising a crystalline phase (other than the cordierite crystal phase) and those comprising porosity, the BSD image was black and white thresholded using ImageJ processing software to highlight dark or black regions which may comprise either porosity or a crystalline phase (other than the cordierite crystal phase). A total area of the surface comprising either porosity or a crystalline phase (confirmed by XRD to comprise sapphirine) was calculated.

Figure 9:
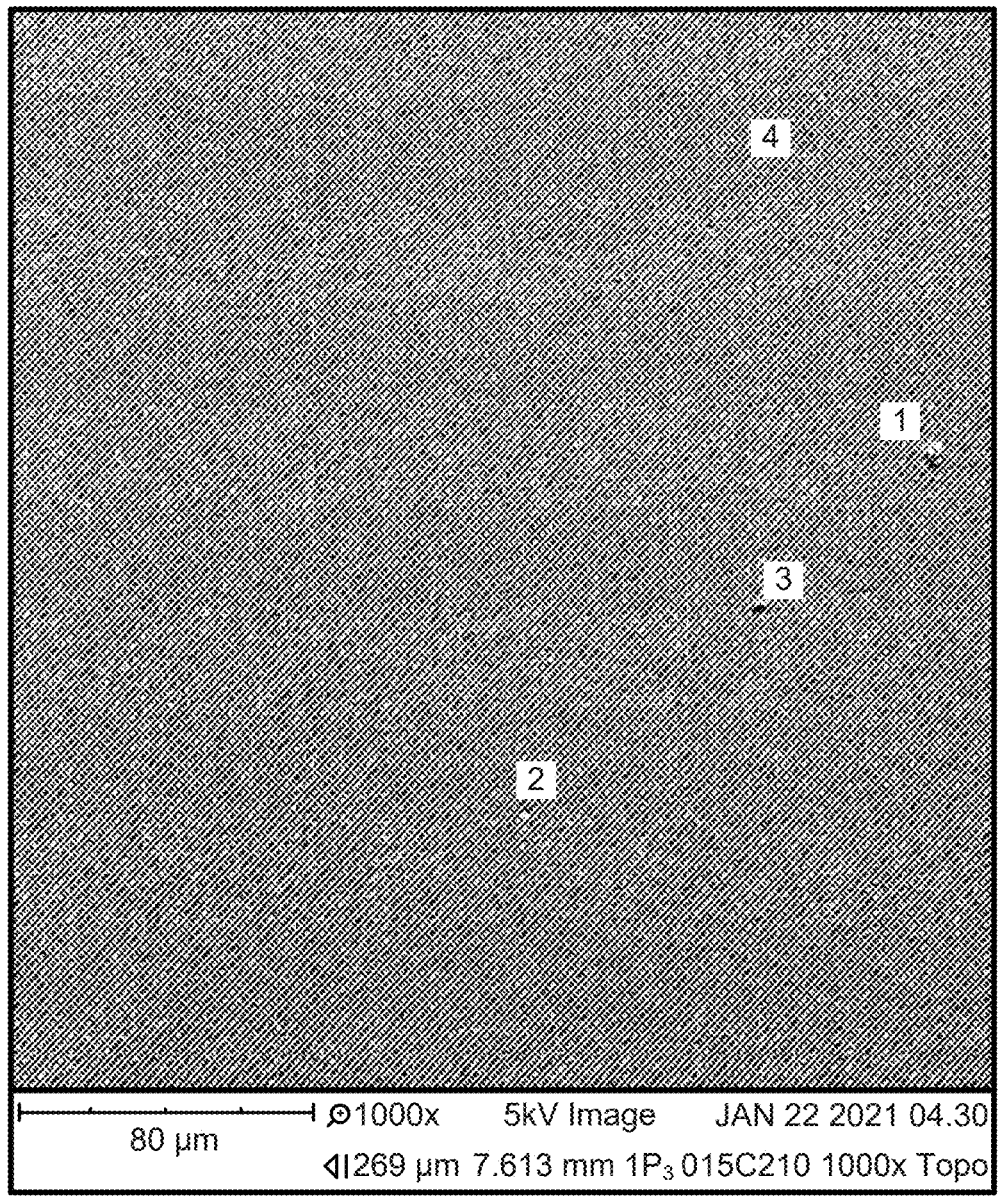
FIG. 9 illustrates an SEM micrograph of the same surface area of FIG. 8 taken using a topographic imaging mode at 1000× of a cordierite sintered body according to embodiments as disclosed herein.

Using the topographic mode of the BSD detector, topographic images (as depicted in FIG. 9) were obtained across a surface of the cordierite sintered body. To identify regions or area comprising porosity, the topographic image was black and white thresholded using ImageJ processing software to highlight black regions in the image which may comprise porosity or surface defects. A total area of the surface comprising porosity was calculated from topographic imaging and subtracted from the total area of the surface comprising either porosity or a crystalline phase to obtain both the percent of the surface comprising porosity and the percent of the surface comprising a crystalline phase (other than cordierite). Using the topographic methods as disclosed, the at least one surface of the cordierite sintered body may comprise porosity in an amount of less than about 1%, preferably less than about 0.9%, preferably less than about 0.8%, preferably less than about 0.6%, preferably less than about 0.3%, preferably less than about 0.1%, preferably about 0.05% with respect to the total area of the at least one surface. Consequently, using XRD, SEM and ImageJ methods, the cordierite sintered body may have a density of about 99%, and may comprise a sapphirine phase in an amount of about 2% by volume (and thereby a cordierite crystalline phase in an amount of about 98%).

The highly phase pure cordierite sintered body as disclosed herein may provide a sintered body having a low linear coefficient of thermal expansion with minimal variation (for example $0.1 \times 10^{-6}$/° C. and less) in CTE across a temperature range of from 0 to 500° C. Suitable choices of the starting powders and careful control of the sintering process may produce a cordierite sintered body comprising the cordierite crystal phase in a majority amount (up to and include 98% by volume) as disclosed.

Figure 7:
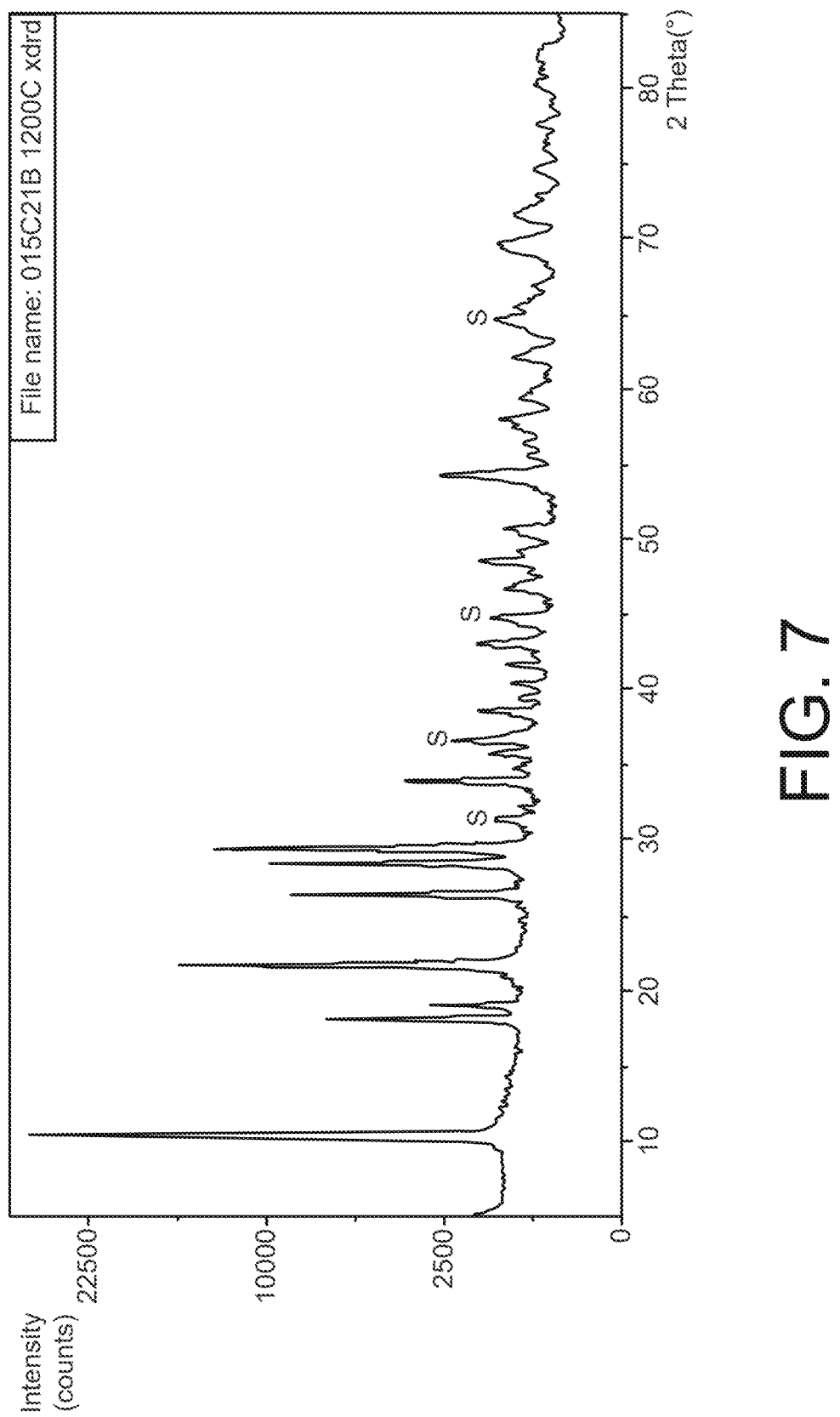
FIG. 7 shows x ray diffraction results of a cordierite sintered body according to embodiments as disclosed herein.

X ray diffraction results for the cordierite sintered body are illustrated in FIG. 7. X ray diffraction results confirmed a highly phase pure sintered body comprising cordierite and sapphirine, an alumina rich phase. All peaks (except those denoted as "S" for sapphirine) corresponded to a cordierite crystalline phase. No peaks corresponding to the starting materials of silica, alumina or magnesia were detected. Using peak intensity ratio comparisons as known to those skilled in the art, the cordierite sintered body as depicted in FIG. 7 comprised the cordierite crystal phase in an amount of about 95% to 98% by volume and the sapphirine crystal phase in an amount of about 2% to 5% by volume of the sintered body.

ImageJ analysis methods were used to assess pore sizes in the cordierite sintered body. The topographic image of FIG. 9 was imported into ImageJ software and thresholded as previously disclosed. Pore sizes were measured within the ImageJ software. As depicted in FIG. 9, the cordierite sintered body according to embodiments as disclosed herein has at least one surface comprising pores having a maximum diameter of about 5 um and less, preferably 4 um and less, preferably 3 um and less, preferably 2 um and less, preferably 1 um and less, as measured using ImageJ software. Feature dimensions may be measured using SEM images combined with ImageJ software to an accuracy of about +/−0.1 um, thus the cordierite sintered body may comprise pores having a diameter of from 0.1 to 5 um, preferably from 0.1 to 4 um, preferably from 0.1 to 3 um, preferably from 0.1 to 2 um, preferably from 0.1 to 1 um.

The surface of the cordierite sintered body comprising porosity and pore sizes in the ranges as disclosed provides a sintered body which may be polished to a very low surface roughness, Sa (for example about 25 nm and less), and peak to valley measurement, Sz (for example less than about 1 um).

To achieve the necessary precision of exposure in order to form semiconductor devices at a very fine feature size, such as 10 nm node sizes and less, deformation, changes in feature dimensions patterned onto the reflective reticle and positional changes of the lithography components due to changes in temperature must be minimized. These effects reduce the exposure precision when patterning semiconductor devices onto a wafer. To maintain exposure precision overall of the lithography apparatus, and more specifically the dimensions of the pattern on the reflective reticle as well as positioning of various components of the lithography apparatus, the linear thermal expansion coefficient (CTE) of the cordierite sintered body used as for example a substrate for the reflective reticle, a reticle chuck, and/or positioning members for optical components according to an embodiment is preferably minimized. Specifically, the absolute value of the linear thermal expansion coefficient is not greater than 1 ppm/° C. (i.e., ≤1×10$^{-6}$/° C.) at temperatures of from 0 to 50° C., preferably the linear coefficient of thermal expansion is about 0+/−0.020 ppm/° C. at temperatures of from 0 to 50° C., as measured in accordance with ASTM E228. One of ordinary skill in the art would recognize that the units for linear coefficient of thermal expansion may alternately be written as for example 1×10$^{-6}$ cm/cm/° C. in accordance with ASTM E228. Linear coefficient of thermal expansion (CTE) measurements were performed according to ASTM E228 using a Linseis Model No. L75VD1600C. Thus, the cordierite sintered body disclosed herein has a low coefficient of thermal expansion, high densities and correspondingly low porosity and high Young's modulus and is particularly suitable for use a component of a EUV reflective reticle, an electrostatic chuck and/or a reticle chuck, and as positioning members for components of a lithography apparatus.

For use in particular as a reflective reticle as part of a lithography apparatus, to maximize device pattern precision during exposure, a very low porosity cordierite sintered body, and in particular a sintered body having low porosity across at least one surface, is desirable. Lower porosity correspondingly results in higher density. The higher the density of the cordierite sintered body, the lower the porosity. The theoretical density value for cordierite is reported as 2.66 g/cc (D. R. Lide, CRC Handbook of Chemistry and Physics, CRC press (2012)), thus all relative density values (or % of theoretical density) are calculated using 2.66 g/cc as the theoretical density of cordierite. The cordierite sintered bodies prepared in accordance with the method as disclosed herein, and cordierite sintered components made from the sintered body have high densities in preferred embodiments. Density measurements were performed using the Archimedes buoyancy method according to ASTM B962-17. The density measurements were performed using the aid of a liquid having a known density, such as water, and also weighing the sample in air, according to the following equation:

$$\text{Density} = \frac{A}{A-B}(D_i - D_a) + D_a$$

Where A=sample weight in air, B=sample weight in liquid, $D_a$=density of air (0.0012 g/cc), and $D_l$=density of the liquid. Using this calculation, densities may be determined with a high degree of accuracy as disclosed herein. Density values as reported herein are for an average across 5 measurements, thus densities as reported are taken to be the average density.

Cordierite sintered bodies made according to the method as disclosed herein have densities (reported as a percentage of the theoretical, or relative, density) of 96% and greater, preferably 97% and greater, preferably 98% and greater, preferably 98.5% and greater, more preferably about 99% and greater, of the theoretical density of cordierite as reported herein. Thus, in other words, a cordierite sintered body made according to the disclosure has a density of from 2.55 to 2.63 g/cc (from 96% to 99% of the theoretical value). In some embodiments, the cordierite sintered body has a density of from 2.58 to 2.63 g/cc (from 97% of the theoretical value to 99% of theoretical), preferably from 2.61 to 2.63 g/cc (from 98% of the theoretical value to 99% of theoretical), preferably from 2.62 to 2.63 g/cc (from 98.5% of the theoretical value to 99% of theoretical) as measured in accordance with ASTM B962-17. As a percentage of theoretical density, the cordierite sintered body may have not less than 96%, preferably not less than 97%, preferably not less than 98%, preferably not less than 98.5%, more preferably not less than 99% of the theoretical value, preferably from 96 to 99% of the theoretical value as reported herein.

The relative density (RD) for a given material is defined as the ratio of the measured density of the sample to the reported theoretical density for the same material, as shown in the following equation. Volumetric porosity (Vp) is calculated from density measurements as follows:

$$RD = \frac{\rho \text{ sample}}{\rho \text{ theoretical}} = 1 - Vp$$

where $\rho$ sample is the measured (Archimedes) density according to ASTM B962-17, $\rho$ theoretical is the reported theoretical density as disclosed herein, and RD is the relative (fractional) density. Using this calculation, volumetric porosity levels (or bulk porosity) by percent of from 0.1 to 4%, preferably from 0.1 to 3%, preferably from 0.1 to 2%, preferably from 0.1 to 1%, preferably from 0.1 to 0.5% were calculated from density measurements performed in accordance with ASTM B962-17 for the cordierite sintered bodies as disclosed herein.

The cordierite sintered body disclosed herein may have porosity both on a surface (evident upon polishing) and throughout the body. Thus, in embodiments, the cordierite sintered body may comprise an integral body made according to the process disclosed herein which comprises porosity distributed throughout the body and measured as volumetric, or bulk, porosity (as calculated from the density measurements disclosed herein). As such, porosity measured on a surface is representative of porosity within a volume, or the bulk of, the cordierite sintered body. Volumetric porosity may be taken as representative of porosity on a surface as measured for example using scanning electron microscopy methods. As used herein, volumetric porosity and bulk porosity are taken to be synonymous.

Movement of the support platforms holding the photomask (or reflective reticle) 100 and/or the substrate (i.e. semiconducting substrate) 80 is necessary during use of the lithography apparatus. This movement produces vibration within the apparatus during exposure and patterning, and the vibration results in positional variations of the support structures, wafer and/or reflective reticle. This results in pattern distortion and decreased exposure precision. A cordierite sintered body having a high degree of stiffness, as measured by the Young's modulus, is desirable to prevent and minimize vibration of the lithography apparatus during use. Measurements to determine Young's modulus were performed in accordance with ASTM E1876-15 using a GrindoSonic MK7 Impulse Excitation Technique (IET) capable of measuring across a frequency range of 10 to 100 KHz with a reference accuracy better than 0.005%. The Young's modulus may be defined as the ratio of tensile or compressive stress to corresponding strain below the proportional limit of the material. Cordierite sintered bodies having a Young's modulus of from 125 to 180 GPa, preferably from 125 to 160 GPa, preferably from 125 to 140 GPa, preferably from 130 to 180 GPa, preferably from 130 to 160 GPa, preferably from about 130 to 150 GPa, as measured in accordance with ASTM E1876-15 may provide sufficient stiffness and high Young's modulus to maintain exposure precision during use of the lithographic apparatus. If the cordierite sintered body has a stiffness, or Young's modulus, which is below the ranges as disclosed, vibration (of various components such as the wafer or reticle chuck, stage and reflective reticle) will occur after movement has stopped and vibration is present during exposure, and a reduction in precision of exposure occurs. The presence of volumetric porosity significantly affects the Young's modulus whereby higher porosity lowers the Young's modulus. The cordierite sintered bodies made by the process as disclosed herein exhibit high values for Young's modulus due to low volumetric porosity levels, providing mechanical stability and resistance to vibration during use within the lithographic apparatus as disclosed herein, enabling patterning of fine scale, high resolution circuitry.

During use as in EUV applications, the reflective reticle may absorb from about 30 to about 100% of the incident radiation, causing significant heating and thermal gradients across the thickness of the reticle. If the thermal conductivity of the reticle is lower than the ranges disclosed, the heat resulting from EUV radiation will not be uniformly distributed across the reticle thickness, resulting in localized heating and high thermal gradients. This localized heating causes thermally induced deformation of the substrate as well as the patterned reticle surface of the reflective layer. This may result in errors within the image projected onto a substrate. As such, the thermal distortion of both the patterned image and the patterning surface is a factor that limits imaging performance in existing EUV lithographic apparatus. Thereby, the effects of localized reticle heating due to radiation absorption can be mitigated by increasing a thermal conductivity of a substrate in a reflective reticle. By increasing the thermal conductivity of the substrate, and thereby lowering a thermal resistance (at a constant thickness), heating due to absorbed radiation may be more uniformly distributed throughout the substrate thickness and may be more effectively conducted away from the substrate to surrounding support devices, including, but not limited to a reticle chuck, and/or a mask table. The thermal conductivity for cordierite is known to be high. The cordierite sintered body as disclosed herein is very dense, substantially phase pure and highly crystalline, which may provide a sintered body which has a high thermal conductivity. As such, in some embodiments, the cordierite sintered body as disclosed herein may have a thermal conductivity of not less than 3.5 W/mK, preferably from 3.5 to 5 W/m K, preferably from 3.5 to 4 W/m K, preferably from 4 to 5 W/m K. The thermal conductivity may be calculated from thermal diffusivity measurements performed in accordance with ASTM E1461-13. Cordierite sintered bodies having thermal conductivities within the disclosed ranges may provide a reticle substrate which may substantially reduce or eliminate any induced distortion of the patterning surface, and thus, any induced errors in the patterned image.

The cordierite sintered body as disclosed has a coefficient of thermal expansion (CTE) of not greater than 1×10–6/° C. and less at temperatures of 0 to 50° C. and between 2 to 3 ppm/° C. at temperatures of between 50 and 500° C.

The above phase purity, densities (and correspondingly lower porosity), porosity (by surface area), pore sizes, elastic modulus and coefficient of thermal expansion of the embodiments of the cordierite sintered body according to the subject disclosure are higher than what was achieved in the prior art for cordierite or low CTE glass. For example, the following information listed in Table 1 is from the Kyocera website while Table 2 lists properties from Ferrotec:

TABLE 1

| | Unit | Low CTE Glass | Low CTE Ceramic <Cordierite CO720> |
|---|---|---|---|
| Density | kg/m³ | 2.53 | 2.55 |
| CTE | ppm/K | 0.02 | 0.02 |
| Young's Modules | GPa | 90 | 144 |
| Rigidity | | 36 | 56 |

*rigidity according to Table 1 is calculated by dividing the Young's Modulus by the density

TABLE 2

| Properties | Units | Test | Value |
|---|---|---|---|
| | | Physical | |
| Chemical Formula | — | — | $2MgO\text{-}2Al_2O_3\text{-}5SiO_2$ |
| Density, ρ | g/cm$^3$ | ASTM C20 | 2.60 |
| Color | — | — | tan |
| Crystal Structure | — | — | orthorhombic |
| Water Absorption | % @ R.T. | ASTM C373 | 0.02-3.2 |
| Hardness | Moh's | — | 7 |
| Hardness | knoop (kg/mm$^2$) | Knoop 100 g | — |
| | | Mechanical | |
| Compressive Strength | MPa @ R.T. | ASTM C773 | 350 |
| Tensile Strength | MPa @ R.T. | ACMA Test #4 | 25.5 |
| Modulus of Elasticity (Young's Mod.) | GPa | ASTM C848 | 70 |
| Flexural Strength (MOR) | MPa @ R.T. | ASTM F417 | 117 |
| Poisson's Ratio, ν | — | ASTM C818 | 0.21 |
| Fracture Toughness, $K_{IC}$ | MPa × m$^{1/2}$ | Notched Beam Test | — |
| | | Thermal | |
| Max. Use Temperature (* denotes inert atm.) | ° C. | No load cond. | 1371 |
| Thermal Shock Resistance | ΔT (° C.) | Quenching | 500 |
| Thermal Conductivity | W/m-K @ R.T. | ASTM C408 | 3.0 |
| Coefficient of Linear Thermal Expansion, $\alpha_I$ | μm/m-° C. (~25° C. through ± 1000° C.) | ASTM C372 | 1.7 |
| Specific Heat, $c_p$ | cal/g-° C. @ R.T. | ASTM C351 | 0.35 |
| | | Electrical | |
| Dielectric Constant | 1 MHz @ R.T. | ASTM D150 | 4.7 |
| Dielectric Strength | kV/mm | ASTM D116 | 5.11 |
| Electrical Resistivity | Ωcm @ R.T. | ASTM D1829 | $10^{14}$ |

* Although we have no reason to doubt the accuracy of the data presented, Ferro-Ceramic Grinding Inc. offers this information for comparison only, and disclaims any and all liability from error, omissions or inaccuracies, such that it does not constitute a warranty of representation for which we shall assume legal responsibility.

Figure 2:
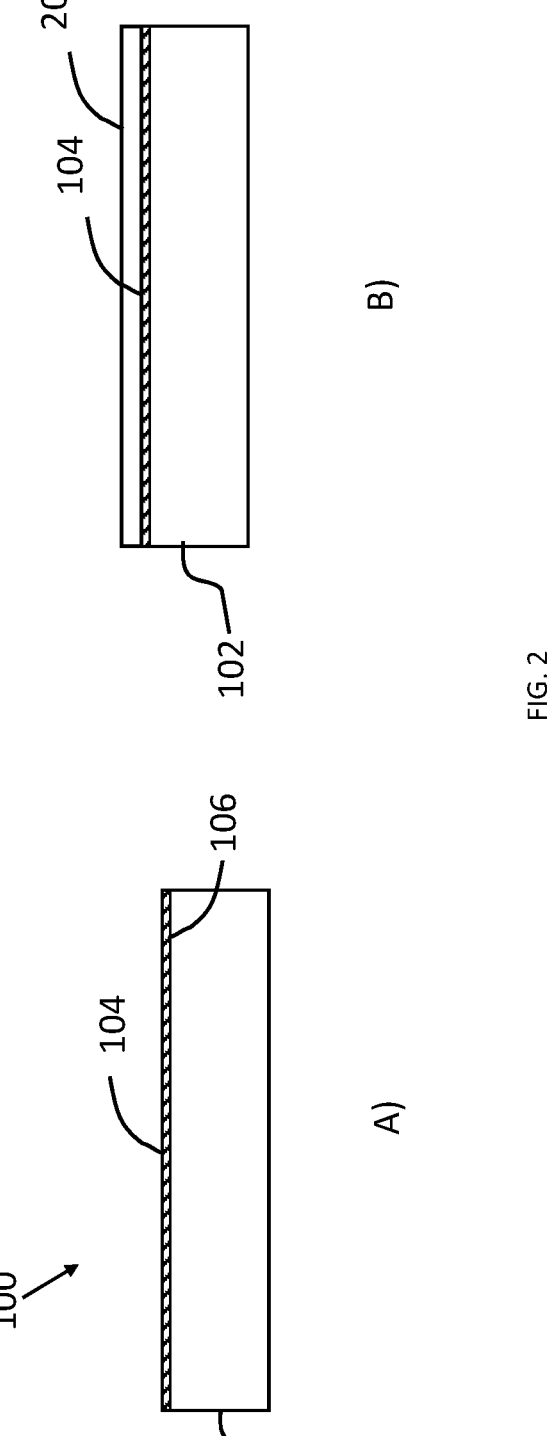
FIG. 2A) and B) schematically depict embodiments of exemplary reflective reticles for use in an EUV lithographic apparatus.

Thus, the cordierite sintered body as disclosed provides an improved material for use in semiconductor applications such as, for example a reticle for transferring a pattern to a wafer, a wafer chuck, a reticle support structure, and positioning structures for optical devices. The high densities of the cordierite sintered body disclosed herein produce a material that may be polished to a very smooth, flat surface providing a fine surface finish for subsequent material depositions. These depositions may be either or both, in any particular order, of a ULE (ultra-low expansion) glass surface layer providing a very smooth surface (very low surface roughness, defect-free and effectively flat), and/or a reflective metal layer such as aluminum, gold, platinum, palladium and/or other metals dependent upon application and performance at frequencies of use which layers may be needed for EUV lithographic reticle applications. In certain embodiments, the low surface roughness (i.e., high smoothness) of the highly dense cordierite sintered body as disclosed herein may allow for the reflective reticle 100 as depicted in FIG. 2A), which in certain embodiments may not comprise a ULE glass surface (when polished to nanometer-scale surface finish). In some embodiments, the surface roughness (for example of about 75 nm and less) of the highly dense cordierite sintered body as disclosed herein may provide for a structure having a very thin layer of the ULE glass surface layer (shown as feature 206 in FIG. 2 B), having a thickness of for example less than about 0.2 mm, preferably less than about 0.1 mm, preferably less than about 0.05 mm, preferably about 0.025 mm. Requirements necessary for EUV lithographic applications necessitate surfaces of the cordierite sintered body that exhibit very low surface roughness (Sa) and very low maximum peak height (Sz, peak to valley) which are substantially free of defects and substantially flat. Although illustrated and described above with reference to certain specific embodiments, the reflective reticle 100 is nevertheless not intended to be limited to the details shown. Rather, various modifications (such as for example additional glass and/or reflective layers) of the reflective reticle 100 may be made within the scope and range of equivalents of the claims and without departing from the spirit of the disclosure.

Surface roughness measurements were performed using a Keyence 3D laser scanning confocal digital microscope model VK-X250X under ambient conditions in a class 1 cleanroom. The microscope rests on a TMC tabletop CSP passive benchtop isolator with 2.8 Hz Natural Frequency. This non-contact system uses laser beam light and optical sensors to analyse the surface through reflected light intensity. The microscope acquires 1,024 data points in the x direction and 786 data points in the y direction for a total of 786,432 data points. Upon completion of a given scan, the objective moves by the pitch set in the z direction and the intensity is compared between scans to determine the focus. The ISO 25178 Surface Texture (Areal Roughness Measurement) is a collection of international standards relating to the analysis of surface roughness with which this microscope is compliant.

The surface of the sample was laser scanned using the confocal microscope at 20× magnification to capture a detailed image of the sample. Roughness was obtained on a profile of 7 partitioned blocks. The lambda chi($\lambda$), which represents the measurement sampling lengths, was adjusted so that the line reading was limited to measurements from the 5 middle blocks of the 7 according to ISO specification 4288: Geometrical Product Specifications (GPS)—Surface texture: Profile method—Rules and procedures for the assessment of surface texture.

Ra as known to those skilled in the art represents the arithmetic mean roughness of the 2D profile according to ISO 4287:1997 Geometrical Product Specifications (GPS)—Surface texture: Profile method. This is based upon a mechanical stylus in contact with a surface to create a linear profile.

Sa represents height differences across a 3D measurement surface using laser methods, while Ra represents height differences across a 2D linear profile scan.

Ra is limited by the stylus tip geometry and as such may result in loss of fine feature detail and distortion of peaks and valleys. This becomes problematic when measuring fine, submicron features and is a limitation in the use of Ra values to compare with Sa values.

Areas were selected within representative, polished regions of the cordierite sintered body for measurement. The surface roughness features of Sa and Sz are well-known parameters in the underlying technical field and, for example, described in ISO standard 25178-2-2012.

The cordierite sintered body having the high densities as disclosed herein (from about 96% of theoretical to about 99% of theoretical) may be polished to a very smooth surface which is substantially free of defects. Lower density sintered bodies have a higher degree of porosity and thereby higher surface roughness and more defects. The high density (and thereby low porosity) of the sintered bodies provides a surface comprising pores having a diameter of 5 um and less and a surface area comprising porosity in an amount of less than 0.8%, preferably less than 0.5%, preferably less than 0.3%, preferably less than 0.1%, preferably about 0.05% with respect to the total area of the at least one surface. The disclosed cordierite sintered body and/or component made therefrom comprising a corrosion resistant, polished surface having the porosity characteristics as disclosed may have an arithmetical mean height (Sa) of 75 nm and less, preferably 50 nm and less, preferably 25 nm and less, preferably 15 nm and less, preferably 10 nm and less, preferably from 2 to 15 nm, preferably from 2 to 10 nm, preferably from 2 to 8 nm, preferably from 2 to 5 nm, and a maximum height/peak to valley (Sz) of less than 5.5 $\mu$m, preferably less than 4.0 $\mu$m, preferably less than 3.0 $\mu$m, preferably less than 2.0 $\mu$m, preferably less than 1.0 $\mu$m, preferably less than 0.75 $\mu$m, preferably from 0.3 to 3 um, preferably from 0.3 to 2 um, preferably from 0.3 to 1 um, as measured on a surface in accordance with ISO standard 25178-2-2012. Without being bound by any particular theory, when the surface roughness and peak to valley is reduced, in certain embodiments it may be possible to reduce the thickness of the ULE glass surface layer, providing for higher thermal conductivity and reduced thermal resistance, thus improving the pattern precision in the reflective reticle, as well as reduced manufacturing steps for assembly.

Method of Making the Cordierite Sintered Body

Preparation of the cordierite sintered body may be achieved by use of pressure assisted sintering combined with direct current sintering and related techniques, which employ a direct current to heat up an electrically conductive die configuration or tool set, and thereby a material to be sintered. This manner of heating allows the application of very high heating and cooling rates, enhancing densification mechanisms over grain growth promoting diffusion mechanisms, which may facilitate preparation of cordierite sintered bodies of very fine grain size and very high density (and thereby low porosity), and transferring the intrinsic properties of the original powders into their near or fully dense products. Direct current sintering techniques as used herein comprised an unpulsed, DC current to facilitate powder consolidation and densification.

A cordierite sintered body may be prepared by a method comprising the steps of: a) combining powders comprising silicon dioxide ($SiO_2$), magnesium oxide (MgO) and aluminum oxide ($Al_2O_3$) to make a powder mixture; b) calcining the powder mixture by applying heat to reach a calcination temperature and maintaining the calcination temperature to perform calcination to produce a calcined powder mixture; c) disposing the calcined powder mixture inside a volume defined by a tool set of a sintering apparatus and creating vacuum conditions inside the volume; d) applying pressure to the calcined powder mixture while heating to a sintering temperature and performing sintering to form the cordierite sintered body; and e) lowering the temperature of the cordierite sintered body. The following additional steps are optional: f) optionally annealing the cordierite sintered body by applying heat to raise the temperature of the cordierite sintered body to reach an annealing temperature, performing annealing; g) lowering the temperature of the annealed cordierite sintered body to an ambient temperature by removing the heat source applied to the cordierite sintered body; and h) machining the cordierite sintered body to create a cordierite sintered component such as a photolithographic reticle, a reflective reticle, a support structure, a wafer stage, a substrate, a composite substrate, a vacuum chuck, a support chuck, an electrostatic chuck (ESC) and a wafer chuck for use in microlithography processes.

The above-mentioned characteristics of the cordierite sintered body are achieved in particular by adapting the purity of the oxides comprising the powder mixture, the mixing and calcination conditions, the pressure to the calcined powder mixture, the sintering temperature of the powder mixture, the duration of sintering of the powder mixture, the temperature of the cordierite sintered body during the optional annealing step, and the duration of the annealing step. The cordierite sintered body is particularly suitable for use as a substrate or layer in a reflective reticle for an EUV lithography process and apparatus. The cordierite sintered body may also be suitable for use as low thermal expansion positioning elements for optical components and as an electrostatic chuck for holding either or both of the reflective reticle and/or the wafer substrate during microlithography processes. The method as disclosed herein is suitable for the production of cordierite sintered bodies, in particular those of large dimension (from 100 to 620 mm diameter), using a scalable manufacturing process.

The method disclosed herein provides for the preparation of cordierite sintered bodies and sintered components comprising preferably from 90 to 99.9% by volume of the cordierite crystalline phase without the use of dopants and/or sintering aids.

In some embodiments, the aforementioned cordierite sintered bodies and sintered components may be made with optional dopants of a rare earth oxide selected from the group consisting of Y, Sc, La, Er, Ce, Cr, Pr, Nd, Pm, Sm, Eu, Gd, Tb, Dy, Ho, Tm, Yb, and Lu and oxides and combinations thereof in amounts of ≥0.0001%, preferably ≥0.0005%, preferably ≥0.0010%, preferably ≥0.0025%, each by weight relative to the total mass of the starting oxide powders, whereby the optional dopant may be added into the starting powders, the powder mixture or the calcined powder mixture. In other embodiments, the aforementioned cordierite sintered bodies and sintered components may be made with the disclosed optional dopants in amounts of ≤0.05%, preferably ≤0.03%, preferably ≤0.01%, preferably ≤0.0075%, preferably ≤0.0050%, preferably ≤0.0025%, each by weight relative to the total mass of the starting oxide powders, whereby the optional dopant may be added into the starting powders, powder mixture or calcined powder mixture.

In alternate embodiments as disclosed herein, the aforementioned cordierite sintered bodies may be made without at least one of, or all of, the aforementioned dopants. In particular, for applications requiring high thermal conductivity and controlled CTE, it may be preferable that the cordierite sintered body is free of dopants. Thus, in certain embodiments, the cordierite sintered body is substantially free of, or free of, at least one of, or all of, the aforementioned dopants.

Sintering aids may be used as needed in the preparation of the cordierite sintered bodies and sintered components as disclosed herein, however they are not required and are optional. In specific embodiments, the cordierite sintered bodies as disclosed herein may comprise an optional sintering aid selected from the group consisting of zirconia and calcia and combinations thereof. These sintering aids in some embodiments may be added in amounts of ≥0.0002%, preferably ≥0.0005%, preferably ≥0.0010%, preferably ≥0.0025%, each by weight relative to the total mass of the starting oxide powders. In other embodiments, the optional sintering aids may be present in amounts of ≤0.05%, preferably ≤0.03%, preferably ≤0.01%, preferably ≤0.0075%, preferably ≤0.0050%, preferably ≤0.0025%, each by weight relative to the total mass of the starting oxide powders, whereby the optional sintering aids may be added into any of the starting powders, powder mixture or calcined powder mixture. For certain applications requiring resistance to corrosion and erosion, high thermal conductivity and controlled CTE, it may be preferable that the cordierite sintered body is free of at least one of, or all of, sintering aids. Thus, in embodiments, the cordierite sintered body is substantially free of, or free of, at least one of, or all of, the aforementioned sintering aids.

Step a) of the method disclosed herein comprises combining powders comprising silicon dioxide ($SiO_2$), magnesium oxide (MgO) and aluminum oxide ($Al_2O_3$) to make a powder mixture. The starting powders for forming a cordierite sintered body and/or sintered component are preferably high purity, commercially available powders. However, other oxide powders may be used, for example those produced from chemical synthesis processes and related methods. The starting powders are chemically purified powders comprising magnesia, silica and alumina which are combined to form a powder mixture batched in ratios to form cordierite (after a sintering step). This method differs from other methods of making cordierite which use starting powders comprising naturally occurring, raw mineral deposits which often contain naturally occurring materials such as talc, kaolin, gibsite, dolomite, sepiolite, forsterite, and various clays and clay-based compounds. These mineral deposits often contain undesirable elements, in particular such as iron, as well as other impurities, which results in a cordierite sintered body which has low purity and is unsuitable for the end application. As such, in order to form a high purity cordierite sintered body, the starting powders, powder mixtures and calcined powder mixtures as disclosed herein are substantially free of, or free of, at least one of, or all of, natural materials comprising talc, kaolin, gibsite, dolomite, sepiolite, forsterite, and other clays and clay-based compounds.

More specifically, the naturally occurring mineral deposits may contain compounds and impurities which contribute to formation of a glassy phase in the cordierite sintered body. Glass-forming constituents present in the mineral deposits may comprise alkali metal elements including lithium (Li), sodium (Na) and potassium (K), alkaline earth metal elements including calcium (Ca), strontium (Sr) and barium (Ba), transition metals including chromium (Cr), nickel (Ni), iron (Fe), copper (Cu), zinc (Zn), lead (Pb), rubidium (Rb) and metalloid elements including boron (B), germanium (Ge), arsenic (As), antimony (Sb) and bismuth (Bi). These glass forming constituents are known to those skilled in the art to form a glassy phase. Formation of a glassy phase (glassy phase as used herein means an amorphous, non-crystalline phase) within the cordierite sintered body may increase variability of the CTE (in particular across a temperature range of from 0 to 500° C.), decrease thermal conductivity and reduce the Young's modulus. A highly phase pure, substantially crystalline cordierite sintered body formed from the high purity starting powders as disclosed herein is desirable to provide a low CTE, high thermal conductivity and high Young's modulus. The XRD results of FIG. 7 depict a highly crystalline cordierite sintered body. By comparison, the XRD results of the calcined powder mixtures of FIG. 6 depict a convex gradation (which may also be described as a "bump" or "hump") in the pattern having a maximum around 22 degrees. This convex gradation may result from nanometer scale, silica particles which produce an XRD pattern similar to that of amorphous, glassy materials which are known to have very limited, or no long-range order (long range order as used herein is intended to mean a material where the atomic particles show periodicity over large numbers of atomic diameters and each atomic particle has specific relationships within the material). The XRD pattern of FIG. 7 does not exhibit such a "hump" and as such, is highly crystalline, providing a cordierite sintered body which is substantially free of, or free of a glassy phase.

Powder features such as the specific surface area (SSA, or BET surface area), and particle sizes were measured for the starting powders. Specific surface area (SSA) for the starting powders, powder mixtures and calcined powder mixtures was measured using a Horiba BET Surface Area Analyzer model SA-9601 capable of measuring across a specific surface area of 0.01 to 2000 m²/g with an accuracy of 10% and less for most samples. BET or SSA Measurements were performed in accordance with ASTM C1274. Particle sizes for the starting powders, powder mixtures and calcined powder mixtures were measured using a Horiba model LA-960 Laser Scattering Particle Size Distribution Analyzer capable of measuring particle size from 10 nm to 5 mm. As disclosed following, the d50 particle size is defined as the median and represents the value where half of the particle population resides above this point, and half resides below this point. Similarly, 90 percent of the distribution lies below the d90 particle size, and 10 percent of the particle population lies below the d10 particle size.

The silicon dioxide ($SiO_2$) powder as disclosed herein preferably comprises a pyrogenic (or fumed) silica powder. Pyrogenic silica powder is known to comprise branched structures and aggregates or agglomerates and as such is non-spherical. The difficulty in particle size measurement of non-spherical particles, and thereby inherently high degree of uncertainty, is known to those skilled in the art. Measurements using the Laser Scattering Particle Size Distribution Analyzer as disclosed herein is based upon the assumption of a substantially spherical particle shape. Pyrogenic silica powder, owing to its method of production (by flame pyrolysis of silicon-containing compounds such as silicon tetrachloride or sand for example) comprises substantially non-spherical agglomerates or aggregates having very high aspect ratios, thus results using the Laser Scattering Particle Size Distribution methods as disclosed herein may not provide sufficient accuracy when measuring the fumed silica powder. As such, particle sizes as reported for the fumed silica powder as disclosed herein are as reported in the literature. Typically, the silica powder as disclosed herein may comprise very small silica crystallites. The silica powder as disclosed herein may comprise a primary particle size (a primary particle may comprise a single particle or single crystallite) of about 100 nm, and a d50 of about 9 um.

The magnesium oxide (MgO) powder may comprise a commercially available, crystalline magnesia powder having a d10 particle size of preferably from 0.03 to 0.3 μm, preferably from 0.05 to 0.3 μm, preferably from 0.075 to 0.3 μm, preferably from 0.1 to 0.3 μm, preferably from 0.03 to 0.25 μm, preferably from 0.03 to 0.15 μm, preferably from 0.03 to 0.075 μm, preferably from 0.1 to 0.2 μm, a d50 (median) particle size of from 0.5 to 5 μm, preferably from 0.5 to 3 μm, preferably from 0.5 to 2 μm, preferably from 1 to 5 μm, preferably from 2 to 5 μm, preferably from 3 to 5 μm, preferably from 1 to 3 μm, and a d90 particle size of from 6 to 30 μm, preferably from 6 to 25 μm, preferably from 6 to 20 μm, preferably from 10 to 30 μm, preferably from 15 to 30 μm, preferably from 15 to 25 μm.

The aluminum oxide powder used as a starting material according to embodiments as disclosed herein may may comprise a commercially available, crystalline alumina having a d10 particle size of be from 0.05 to 2 μm, preferably from 0.05 to 1 μm, preferably from 0.05 to 0.75 μm, preferably from 0.05 to 0.5 μm, preferably from 0.08 to 2 μm, preferably from 0.1 to 2 μm, preferably from 0.2 to 2 μm, preferably from 0.5 to 2 μm, preferably from 0.2 to 2 μm, preferably from 0.05 to 0.1 μm, more preferably from 0.08 to 0.1 μm.

The d50 particle size of the aluminum oxide powder used as a starting material is from 0.15 to 5 μm, preferably from 0.15 to 4 μm, preferably from 0.15 to 3 μm, preferably from 0.15 to 2 μm, preferably from 0.15 to 1 μm, preferably from 0.15 to 0.75 μm, preferably from 0.15 to 0.5 μm, preferably from 0.2 to 5 μm, preferably from 0.5 to 3 μm, preferably from 1 to 3 μm, more preferably from 0.15 to 0.3 μm.

The d90 particle size of the aluminum oxide powder used as a starting material is from 0.5 to 10 um, preferably from 0.75 to 10 um, preferably from 1 to 10 um, preferably from 3 to 10 um, preferably from 0.75 to 5 um, preferably from 0.5 to 3 um, preferably from 0.5 to 1 μm, more preferably from 0.5 to 0.8 μm.

The silicon dioxide ($SiO_2$) may have a specific surface area (SSA) of from 20 to 40 $m^2/g$, preferably from 20 to 35 $m^2/g$, preferably from 20 to 30 $m^2/g$, preferably from 25 to 40 $m^2/g$, preferably from 30 to 40 $m^2/g$, preferably about 30 $m^2/g$ and more preferably from 25 to 35 $m^2/g$.

The magnesium oxide (MgO) may have a specific surface area of from 2 to 10 $m^2/g$, preferably from 2 to 8 $m^2/g$, preferably from 2 to 6 $m^2/g$, preferably from 4 to 10 $m^2/g$, preferably from 4 to 8 $m^2/g$, and more preferably from 4 to 6 $m^2/g$.

The aluminum oxide powder typically has a specific surface area of from 5 to 18 $m^2/g$, preferably from 5 to 16 $m^2/g$, preferably from 5 to 14 $m^2/g$, preferably from 5 to 12

$m^2/g$, preferably from 5 to 10 $m^2/g$, preferably from 7 to 18 $m^2/g$, preferably from 9 to 18 $m^2/g$, preferably from 12 to 18 $m^2/g$, preferably from 15 to 18 $m^2/g$.

The purity of the silicon dioxide ($SiO_2$), and aluminum oxide ($Al_2O_3$) powders used as starting materials are preferably not less than 99.99%, more preferably not less than 99.999%, and most preferably about 99.9999% relative to 100% pure silica and alumina.

The purity of the magnesium oxide (MgO) powder is preferably not less than 99.9%, preferably not less than 99.95%, more preferably not less than 99.99%.

The starting powders of magnesia and alumina are preferably crystalline, and thereby have a long-range crystallographic order. Each of, or all of the starting powders of magnesia, silica and alumina may be sieved, tumbled, blended, milled, jet milled, etc. according to methods known to those skilled in the art. In some embodiments, the starting powders of magnesia, silica and alumina may be optionally calcined according to methods as known to those skilled in the art to achieve the powder characteristics as disclosed herein.

Figure 4:
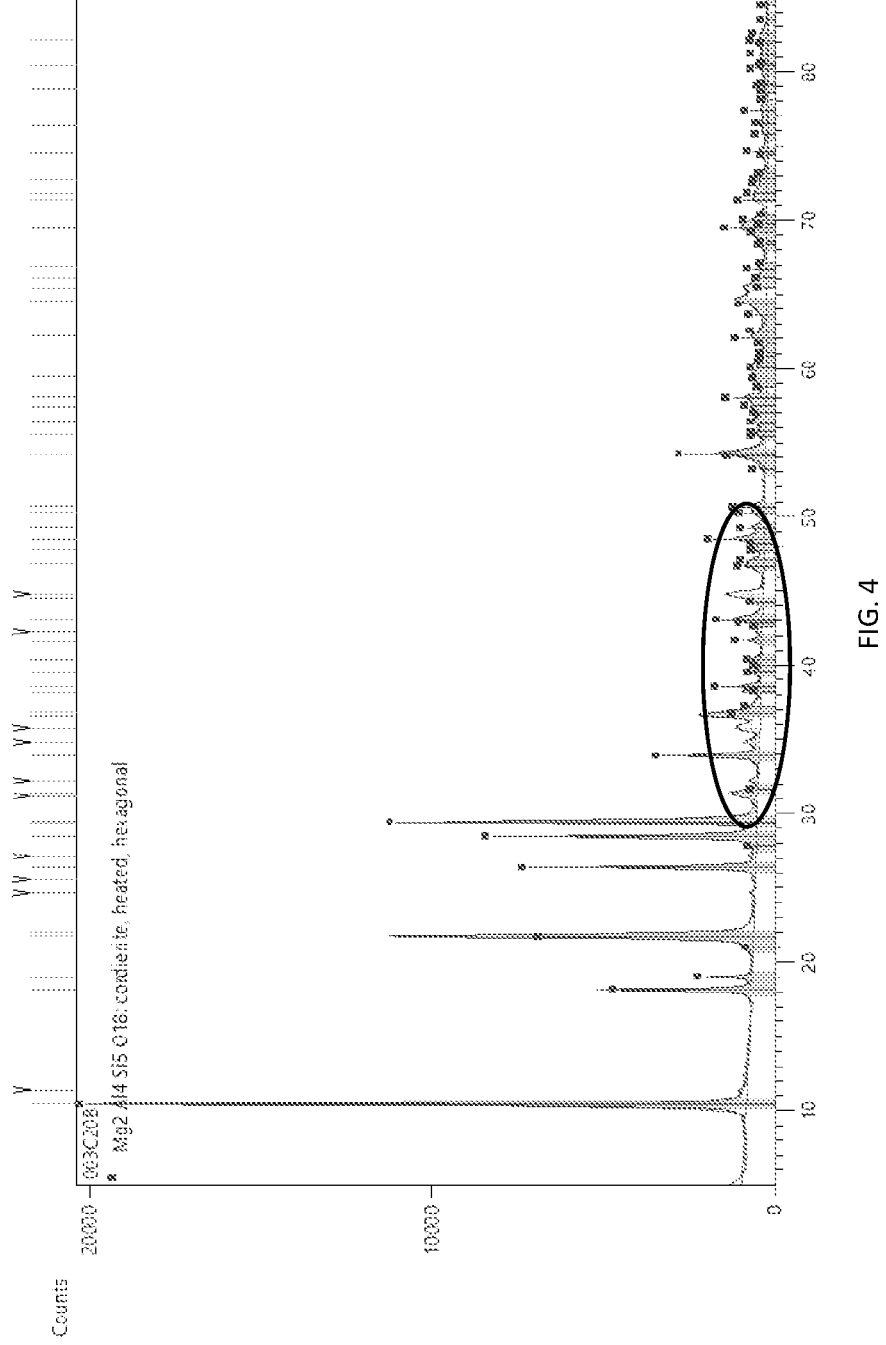
FIG. 4 depicts x ray diffraction results of the cordierite sintered body of comparator example one.
Figure 5:
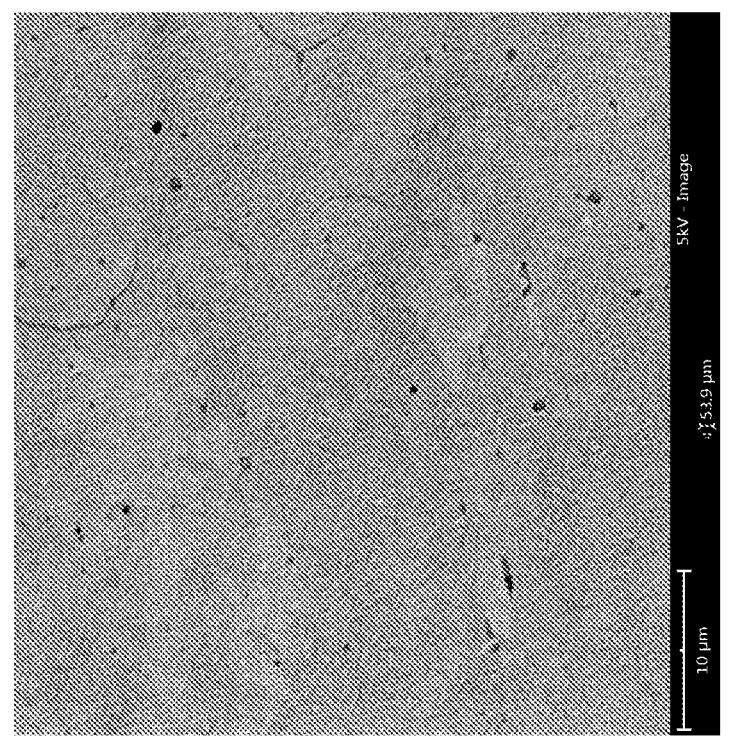
FIG. 5 shows a micrograph at 5000× of the cordierite sintered body of FIG. 4 and comparator example one.

The cordierite sintered bodies according to the comparator examples as disclosed herein were made with a silica granulate having a d50 of from 200 to 250 um and a calcined powder mixture formed therefrom having a d50 of about 13 um and d90 of about 90 um. These values for d50 and d90 may indicate powder agglomeration, forming larger sized crystallites and residual phases present in the microstructure upon sintering. This particle size distribution resulted in microcracking (as depicted in FIG. 5) upon sintering due to CTE mismatches between the silica-rich agglomerates and other phases in the cordierite sintered body, as well as residual, silica rich phases of quartz, such as tridymite or cristobalite, as depicted in the XRD pattern of FIG. 4 for comparator example one. Use of starting powders and powder mixtures having d50 and d90 particle sizes less than those of the comparator examples and preferably within the ranges as disclosed, combined with the disclosed high energy mixing processes provides more uniform and smaller particle size distributions. This combination of the disclosed starting powders to form the powder mixtures, the calcined powder mixtures having the characteristics as disclosed herein, and the disclosed reactive, in-situ process to form cordierite, enable formation of the cordierite sintered bodies having the preferable properties as disclosed herein.

In one embodiment, the powder mixture comprises a molar ratio of about 22.2 mol % MgO, about 22.2 mol % $Al_2O_3$ and about 55.6 mol % $SiO_2$ as the starting powder mixture. Representative characteristics of the starting powders are listed in Table 4.

TABLE 3

| POWDER | SSA (m2/g) | d10 (um) | d50 (um) | d90 (um) | % Purity |
|---|---|---|---|---|---|
| SiO2 | 20-40 | 0.03-0.3 | 0.2-5 | 40-120 | 99.995%+ |
| Al2O3 | 5-18 | 0.05-2 | 0.15-5 | 0.5-10 | 99.995%+ |
| MgO | 2-10 | 0.03-0.3 | 0.5-5 | 6-30 | 99.99+ |

Combining the aforementioned powders comprising silicon dioxide ($SiO_2$), magnesium oxide (MgO) and aluminum oxide ($Al_2O_3$) to make powder mixtures may be performed using the powder preparation techniques of ball (axially rotating) milling, tumble (end-over-end or vertical) mixing, jet milling, and combinations of these.

Ball milling or end-over-end/tumble mixing processes are preferably performed under wet conditions. Using wet mixing conditions, the starting powders, which are weighed in relative amounts to form the cordierite crystalline phase, may be ball milled or end-over-end/tumble mixed using high purity (≥99.99%) alumina media in order to preserve the purity of the starting powders during mixing. In other embodiments, zirconia media may be used to break up hard agglomerates. All purity measurements disclosed herein are those measured above the reporting limit for a specific element and were completed using an ICP-MS from Agilent 7900 ICP-MS model G8403. The high purity alumina media was tested using ICPMS methods as disclosed herein and found to have a purity of about 99.99% and greater. Media used to perform the combining process may have a range of diameters, for example from 5 to 20 mm, preferably from 10 to 20 mm, more preferably about 20 mm in diameter, added at a loading of from about 75 to about 200%, preferably from about 100 to about 200%, more preferably from about 125 to about 175%, of media weight relative to powder weight.

The starting powders of silica, magnesia and alumina may be suspended in various solvents such as ethanol, methanol, and other alcohols, to form a slurry. The slurries formed (for either ball milling or tumble mixing processes) may comprise ethanol in an amount of from 100 to 300%, preferably from 150 to 300%, preferably from 200 to 300%, preferably from 250 to 300%, preferably from 150 to 250% of ethanol by weight relative to total powder weight. The amount of ethanol may be adjusted as needed to ensure sufficient mobility of the media in the slurry to thoroughly mix the powders.

Use of ball milling and tumble mixing are high energy processes which break down particulates and agglomerates and may provide for a homogeneous powder mixture prior to calcination. The word "homogeneous" means that a powder or powder mixture has substantially the same property throughout; it is uniform without irregularities. Thus, by "homogeneous powder mixture" is meant that the particle size distribution (PSD) and specific surface area (SSA) are spatially uniform and do not have considerable gradients in specific surface area or particle size distribution, i.e., a substantially uniform powder or powder mixture exists. Wet mixing provides for improved dispersion of the powders through increased mobility, resulting in fine scale, uniform mixing before heat treatment or calcination. Wet ball milling or tumble mixing may be performed for durations of from 8 to 48 hours, preferably from 12 to 48 hours, preferably from 16 to 48 hours, preferably from 8 to 36 hours, preferably from 8 to 24 hours, preferably from 16 to 24 hours preferably from 12 to 24 hours. Ball milling may use an RPM (revolutions per minute) of from 50 to 250 RPM, preferably from 75 to 200 RPM, preferably from 75 to 150 RPM, preferably between 100 and 125 RPM, each for containers having about 200 mm diameter. RPMs may vary dependent upon the dimensions of containers selected for use, and those greater than for example 200 mm in diameter may have correspondingly lower RPM as known to those skilled in the art. Wet end over end/tumble (or vertical) mixing may be performed at an RPM of from 10 to 30 rpm, preferably about 20. The powder slurries are dried according to known methods. After wet ball milling and/or wet end-over-end/tumble mixing and drying, the powder mixture may be optionally sieved using any number of meshes which may have openings of for example from 45 to 400 um, and blended, without limitation as to repetition or order.

Jet milling processes as known to those skilled in the art may also be used to modify the particle size distributions of the starting powders and/or to thoroughly mix the powders to form a powder mixture or calcined powder mixture having a narrow particle size distribution. Jet milling uses high velocity jets of either inert gases or air to collide particles of the powders without the use of milling or mixing media, thus preserving initial purity of the powders to be milled. The chamber may be designed such that larger particles may be preferentially reduced in size, which may provide a narrow particle size distribution in the powders. Powders exit the jet milling chamber upon reaching a desired particle size as determined at setup of the machine prior to processing. Starting powders, powder mixtures and/or calcined powder mixtures as disclosed herein may be subjected to jet milling at pressures of about 100 psi, whether separately, or in combination with any, or all of, the as disclosed powder milling/mixing processes as disclosed herein. After jet milling, the powders or powder mixtures may be optionally sieved using any number of meshes which may have openings of for example from 45 to 400 um, and blended, without limitation as to repetition or order.

The aforementioned mixing and milling methods which either do not require media, or those which use high purity alumina media as disclosed herein, maintain the purity of the starting powders during the combining process, thereby providing a cordierite sintered body formed therefrom having a very high purity. Cordierite sintered bodies having purities of greater than 99.99%, preferably greater than 99.995%, preferably about 99.999% (relative to a cordierite sintered body of 100% purity) are disclosed whereby purity of the starting powders is maintained in the calcined powder mixtures as disclosed herein, and throughout the method as disclosed herein.

The aforementioned powder preparation techniques may be used alone or in any combination thereof, or upon more than one powder mixture which are thereafter combined and sintered into a final, cordierite sintered body.

Step b) of the method as disclosed herein comprises calcining the powder mixture by applying heat to reach a calcination temperature and maintaining the calcination temperature to perform calcination to produce a calcined powder mixture. This step may be performed such that moisture may be removed and surface condition of the cordierite powder is uniform prior to sintering. In some embodiments, calcination may be performed to reduce surface area of the starting powders and/or the powder mixture, while in other embodiments, calcination may not cause a reduction in surface area of the powders. Higher calcination temperatures may provide a reduction in specific surface area and may be adjusted to within the disclosed ranges. Calcination in accordance with the heat treatment step may be performed at temperatures of from about 600° C. to about 1000° C., preferably from about 700° C. to about 1000° C., preferably from about 800° C. to about 1000° C., preferably from about 600° C. to about 900° C., preferably from about 600° C. to about 800° C., preferably from about 700° C. to about 900° C. Calcination may be performed for durations of from 4 to 12 hours, preferably from 4 to 10 hours, preferably from 4 to 8 hours, preferably from 6 to 12 hours, preferably from 5 to 7 hours in an oxygen containing environment. The powder mixtures may be optionally sieved before or after calcination using a mesh having openings of for example from 45 to 400 um and may be tumbled and/or mixed and/or blended and combinations thereof without limitation as to repetition or order as performed according to known methods. Tumbling and/or blending and/or mixing may be performed on the powder mixtures and/or calcined powder mixtures without media or using high purity (>99.9%) alumina media, or zirconia media as disclosed herein, according to known methods.

Figures 6A, 6B:
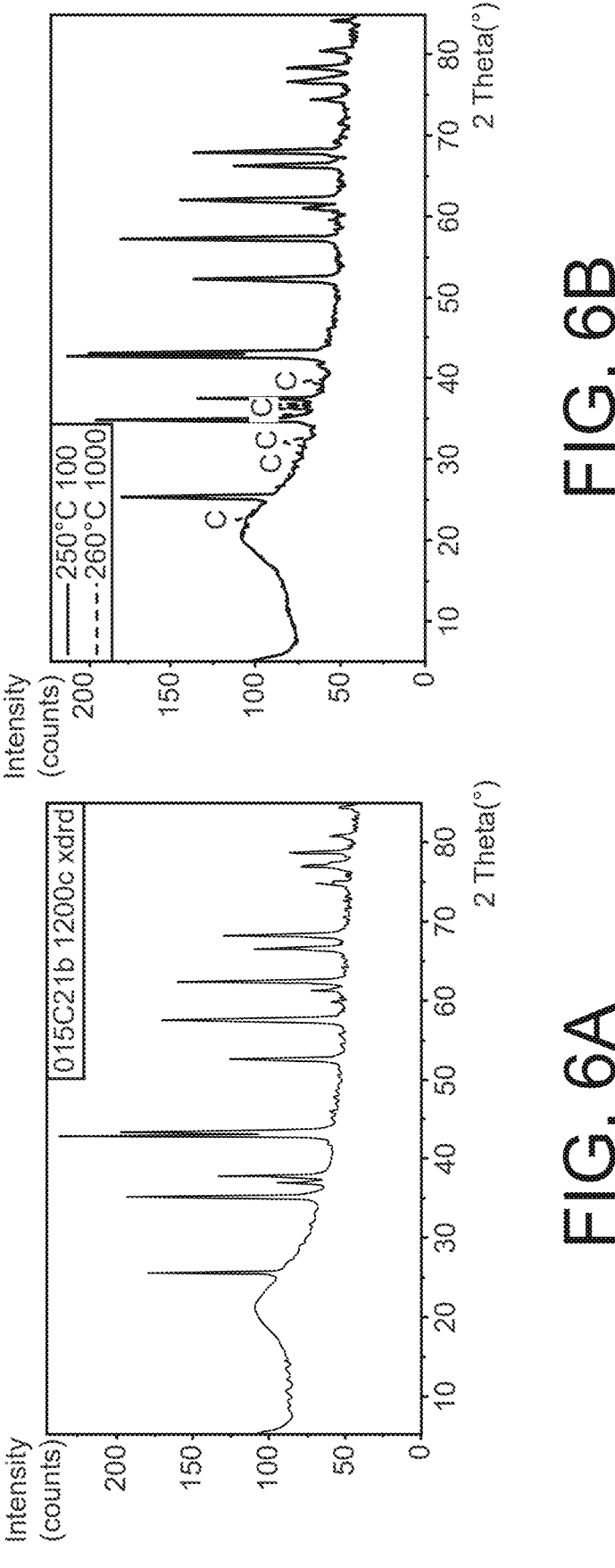
FIG. 6 shows x ray diffraction results of calcined powder mixtures according to embodiments as disclosed herein.

Dependent upon the calcination conditions of temperature and duration, in embodiments, calcination may result in a calcined powder mixture comprising magnesium oxide, silica and aluminium oxide present from the starting powders as depicted in FIG. 6A for calcination conditions of 600° C. for 6 hours. In other embodiments, higher temperature calcination conditions may result in a calcined powder mixture comprising a powder having the cordierite crystalline phase and crystalline phases corresponding to the starting powders, as depicted in FIG. 6B for 900° C. and 1000° C. for 6 hours.

After calcination, the specific surface area and particle size of the calcined powder mixtures were measured using the methods as disclosed herein.

The calcined powder mixture combined in powder ratios to form the cordierite crystal phase upon sintering may have a d10 particle size of from 0.05 to 3 μm, from 0.05 to 2 μm, from 0.05 to 1 μm, preferably from 0.1 to 3 μm, preferably from 0.1 to 2 μm, preferably from 0.25 to 3 μm, preferably from 0.25 to 1 μm, preferably from 0.05 to 0.5 μm, preferably from 0.1 to 0.3 μm.

The d50 particle size of the calcined powder mixture may have a d50 particle size of from 0.2 to 5 μm, preferably from 0.2 to 4 μm, preferably from 0.2 to 3 μm, preferably from 0.2 to 2 μm, preferably from 0.2 to 1 μm, preferably from 0.2 to 0.5 μm.

The d90 particle size of the calcined powder mixture may have a d90 particle size of from 10 to 75 μm, preferably from 10 to 70 μm, preferably from 10 to 60 μm, preferably from 10 to 50 μm, preferably from 10 to 40 μm, preferably from 20 to 75 μm, preferably from 40 to 75 μm, preferably from 50 to 75 μm, preferably from 50 to 70 μm, preferably not greater than 75 μm and not less than 20 μm.

The specific surface area of the calcined powder mixture may be from 8 to 20 m²/g, preferably from 10 to 20 m²/g, preferably from 12 to 20 m²/g, preferably from 14 to 20 m²/g, preferably from 16 to 20 m²/g, preferably from 8 to 18 m²/g, preferably from 8 to 16 m²/g, preferably from 8 to 14 m²/g, preferably from 10 to 20 m²/g, preferably from 14 to 20 m²/g, preferably from 16 to 20 m²/g.

Before and/or after calcination, the cordierite powder may be sieved and/or tumbled according to known methods. If the surface area of the calcined powder mixture is greater than about 20 m²/g, it becomes difficult to handle the powder during loading of the tool set of the sintering apparatus, in particular at large part sizes. If the surface area of the calcined powder mixture is less than about 8 m²/g, the driving force for formation of the cordierite crystalline phase during the in-situ, reactive sintering step is reduced and may result in a lower density sintered cordierite body. In some embodiments, it may be preferable that the powder mixture after calcination FIG. 6 illustrates XRD results of calcined powder mixtures as disclosed herein. FIG. 6A illustrates an exemplary calcined powder mixture as disclosed herein which was calcined at 600° C. for 6 hours in air, while FIG. 6B depicts an overlay of two exemplary calcined powder mixtures as disclosed herein whereby one powder was calcined at 900° C. for 6 hours in air and the other was calcined at 1000° C. for 6 hours in air. Formation of the cordierite crystal phase is denoted by "C" in the XRD pattern of FIG. 6B. The cordierite sintered bodies as disclosed herein typically have a hexagonal crystal structure. Table 4 lists a range of properties of the calcined powder mixtures as disclosed herein.

TABLE 4

| SSA (m²/g) | d10 (um) | d50 (um) | d90 (um) | % purity |
|---|---|---|---|---|
| 8-20 | .05-3 | 0.2-5 | 10 to 75 | 99.99+ |

Step c) of the method disclosed herein comprises disposing the calcined powder mixture inside a volume defined by a tool set of a sintering apparatus and creating vacuum conditions inside the volume. A sintering apparatus used in the process according to an embodiment comprises a tool set comprising at least a graphite die which is usually a cylindrical graphite die having a volume and first and second openings, further comprising first and second punches. The first of the punches is moved within the first opening of the die, and the calcined powder mixture is disposed within the second opening of the die, and the second punch is moved within the second opening of the die, thereby disposing the calcined powder mixture inside the volume defined by the tool set of the sintering apparatus. The calcined powder mixture (batched to form the cordierite phase upon sintering) is disposed in the tool set. Vacuum conditions as known to those skilled in the art are established within the volume created by the tool set. Typical vacuum conditions include pressures of $10^{-2}$ to $10^{-3}$ torr. The vacuum is applied primarily to remove air to protect the graphite from burning and to remove a majority of the air from the powder.

The method as disclosed utilizes commercially available, highly pure silica, magnesia and alumina powders (and/or those prepared from chemical synthesis techniques), without the need for sintering aids, dopants, cold pressing, forming or machining a green body prior to sintering. The starting powders to form the calcined powder mixture preferably do not comprise the naturally occurring, raw materials as disclosed herein, which are often high in undesirable impurities, and as such disclosed herein is a calcined powder mixture which is substantially free of, or free of, naturally occurring materials comprising talc, kaolin, gibsite, dolomite, sepiolite, forsterite, and various clays and clay-based compounds.

Step d) of the method disclosed herein includes applying pressure to the calcined powder mixture while heating to a sintering temperature and performing sintering to form the cordierite sintered body and step e) lowering the temperature of the cordierite sintered body by removing the heat source to the sintering apparatus to cool the cordierite sintered body. Pressure is applied to the calcined powder mixture disposed inside the volume defined by the tool set in a range of from 5 MPa to 100 MPa, preferably from 5 MPa to 60 MPa, preferably from 5 MPa to 45 MPa, preferably from 5 MPa to 20 MPa, preferably from 10 MPa to 60 MPa, preferably from 10 MPa to 45 MPa, preferably from 10 to 40 MPa, preferably from 10 to 30 MPa, preferably from 10 to 20 MPa, preferably from 15 to 45 MPa, preferably from 15 MPa to 30 MPa, preferably from 20 to 40 MPa. The pressure is applied axially on the material provided in the die.

In preferred embodiments, the powder mixture is heated directly by the punches and die of the sintering apparatus. The die is comprised of an electrically conductive material such as graphite, which facilitates resistive/joule heating. The sintering apparatus and procedures are disclosed in US 2010/0156008 A1, which is incorporated herein by reference.

The temperature of the sintering apparatus according to the present disclosure is measured usually within the graphite die of the apparatus. Thereby, it is preferred that the temperature is measured as close as possible to the cordierite powder being processed so that the indicated temperatures are indeed realized within the powder to be sintered.

The application of heat to the powder mixture provided in the die facilitates sintering temperatures from 900 to 1300° C., preferably from 900 to 1250° C., preferably from 900 to 1200° C., preferably from 900 to 1150° C., preferably from 900 to 1100° C., preferably from 1000 to 1300° C., preferably from 1050 to 1300° C., preferably from 1100 to 1300° C., preferably from 1150 to 1300° C., preferably from 1200 to 1300° C., preferably from 1150 to 1250° C.

Sintering may typically be achieved with an isothermal time of from 0.5 to 180 minutes, preferably from 0.5 to 120 minutes, preferably from 0.5 to 100 minutes, preferably from 0.5 to 80 minutes, preferably from 0.5 to 60 minutes, preferably from 0.5 to 40 minutes, preferably from 0.5 to 20 minutes, preferably from 5 to 120 minutes, preferably from 10 to 120 minutes preferably from 20 to 120 minutes preferably from 40 to 120 minutes preferably from 60 to 120 minutes, preferably from 80 to 100 minutes, preferably from 85 to 95 minutes, preferably from 10 to 60 minutes, preferably from 10 to 45 minutes, preferably from 10 to 30 minutes. In certain embodiments, sintering may be achieved with no isothermal time and upon reaching the sintering temperature, a cooling rate as disclosed herein is initiated. In process step e), the cordierite sintered body is passively cooled by removal of the heat source. Natural convection may occur until a temperature is reached which may facilitate handling of the cordierite sintered body and initiation of the optional annealing and/or machining processes.

During sintering, a volume reduction typically occurs such that the cordierite sintered body may comprise a volume that is about one third that of the volume of the starting powder when disposed in the tool set of the sintering apparatus.

The order of application of pressure and temperature in one embodiment may vary according to the subject disclosure, which means that it is possible to apply at first the indicated pressure and thereafter to apply heat to achieve the desired temperature. Moreover, in other embodiments it is also possible to apply at first the indicated heat to achieve the desired temperature and thereafter the indicated pressure. In a third embodiment according to the present disclosure, the temperature and the pressure may be applied simultaneously to the cordierite powder to be sintered and raised until the indicated values are reached.

Inductive or radiant heating methods may also be used for heating the sintering apparatus and indirectly heating the cordierite powder in the tool set.

In contrast to other sintering techniques, preparation of the sample prior to sintering, i.e., by cold pressing or forming a green body before sintering is not necessary, and the cordierite powder is filled directly into the mould. This reduced processing step may provide for higher purity in the final, cordierite sintered body.

In further contrast to other sintering techniques, sintering aids are not required. Additionally, high purity starting powders is desirable for formation of a cordierite sintered body having high (about 80% and greater by volume) cordierite phase in the sintered body, which results in a low CTE of preferably not greater than $1 \times 10^{-6}$ ppm/° C. across a temperature range of from 0 to 50° C. The presence of other phases, whether amorphous or crystalline, impacts the CTE value and variance in CTE across the specified temperature range. Thus, is it preferable to have a phase pure, cordierite sintered body. The lack of sintering aids and dopants and the use of high purity starting materials, having a purity of from 99.9% to 99.995% and greater purity relative to powders comprising 100% (comprising only the respective oxide, without impurities, sintering aids or dopants) of their respective oxides, enables the fabrication of a high purity, cordierite sintered body wherein the cordierite sintered body has a purity of from 99.9 to 99.995%, preferably from 99.95 to 99.995%, preferably from 99.99 to 99.995% relative to 100% purity of the cordierite sintered body.

In further contrast to other sintering techniques, a cordierite sintered body comprising the cordierite phase in amounts of greater than 90% by volume may be formed by in situ, reactive sintering during the sintering step by way of the combined properties of particle size distribution, purity, specific surface area of the calcined powder mixtures as disclosed, and the sintering conditions of pressure, temperature and time.

In one embodiment, process step d) may further comprise a pre-sintering step with a specific heating ramp of from 0.1° C./min to 100° C./min, preferably 1° C./min to 50° C./min, more preferably 2 to 25° C./min until a specific pre-sintering time is reached.

Total purity of the cordierite sintered body as disclosed herein may be higher than 99.9%, preferably higher than 99.99%, preferably higher than 99.995%, preferably about 99.999% relative to 100% pure cordierite.

In another embodiment, process step d) may further comprise a pre-sintering step with the above-mentioned specific heating ramp and with the above-mentioned specific pressure ramp.

At the end of process step d), in an embodiment, the method may further comprise step e), cooling of the cordierite sintered body in accordance with a natural cooling of the process chamber (unforced cooling) under vacuum conditions as known to those skilled in the art. In a further embodiment in accordance with process step e), the cordierite sintered body may be cooled under convection with inert gas, for example, at 1 bar of argon or nitrogen. Other gas pressures of greater than or less than 1 bar may also be used. In a further embodiment, the cordierite sintered body is cooled under forced convective conditions in an oxygen environment. To initiate the cooling step, the power applied to the sintering apparatus is removed and the pressure applied to the cordierite sintered body is removed at the end of the sintering step d) and thereafter cooling occurs in accordance with step e).

Formation of the high density, phase pure cordierite sintered bodies as disclosed herein is achieved through a reactive sintering process whereby cordierite is formed in-situ from starting powders of silica, magnesia and alumina without the use of naturally occurring, raw materials.

Properties of cordierite sintered bodies are listed in Table 5. Comparator samples 3 and 18 are included for the feature of their respective high densities.

TABLE 5

| Sample | Sintering T (° C.) | Sintering P (MPa) | Sintering Time (min) | Ave Density (g/cc) | % theoretical | % Bulk Porosity |
|--------|--------------------|--------------------|----------------------|--------------------|---------------|-----------------|
| 003 | 1200 | 30 | 30 | 2.62 | 98.50 | 1.50 |
| 018 | 1185 | 30 | 30 | 2.62 | 98.50 | 1.50 |
| 015 | 1200 | 15 | 30 | 2.573 | 96.73 | 3.27 |

Step f) of the method disclosed herein is optionally annealing the cordierite sintered body by applying heat to raise the temperature of the cordierite sintered body to reach an annealing temperature, performing annealing and step g) is lowering the temperature of the annealed ceramic sintered body. In optional step f), the resulting cordierite sintered body or component of steps d) or h) respectively may be subjected to an annealing procedure. In other instances, annealing may not be performed on the cordierite sintered body or component. Under other circumstances, annealing may be performed in a furnace external to the sintering apparatus, or within the sintering apparatus itself, without removal from the apparatus.

For the purpose of annealing in accordance with this disclosure, the cordierite sintered body may be removed from the sintering apparatus after cooling in accordance with process step e), and the process step of annealing may be conducted in a separate apparatus such as a furnace.

In some embodiments, for the purpose of annealing in accordance with this disclosure, the cordierite sintered body in step d) may subsequently be annealed while inside the sintering apparatus, without the requirement of removal from the sintering apparatus between the sintering step d) and the optional annealing step.

This annealing leads to a refinement of the chemical and physical properties of the sintered body. The step of annealing can be performed by conventional methods used for the annealing of glass, ceramics and metals, and the degree of refinement can be selected by the choice of annealing temperature and the duration of time that annealing is allowed to continue.

Usually, the optional step f) of annealing the cordierite sintered body is carried out at a temperature of from about 800 to about 1200° C., preferably from about 900 to about 1200° C., preferably from about 1000 to about 1200° C., and more preferably from about 900 to about 1100° C.

The optional annealing step f) is intended to correct oxygen vacancies in the crystal structure back to stochiometric ratio. The step of annealing the cordierite usually requires from 1 to 24 hours, preferably from 1 to 20 hours, preferably from 1 to 16 hours, more preferably from 4 to 8 hours in an oxygen containing environment.

Usually, the optional process step f) of annealing the ceramic sintered body is carried out in an oxidizing atmosphere, whereby the annealing process may provide increased albedo, lowered stress providing improved mechanical handling and reduced porosity. The optional annealing step may be carried out in air.

After the optional process step f) of annealing the cordierite sintered body is performed, the temperature of the sintered, and in some instances, annealed cordierite sintered body is decreased to an ambient temperature in accordance with process step g) and the sintered and optionally annealed cordierite body is taken out of either the furnace in the instance that the annealing step is performed external to the sintering apparatus, or removed from the tool set in case the annealing step f) is carried out in the sintering apparatus.

The cordierite sintered body may then be machined, cut, and/or polished into the final body such as, for example, a substrate for reticle for use in an EUV lithographic process. Machining of the cordierite sintered body to create a cordierite sintered component may be carried out according to known to those skilled in the art. For example, the cordierite sintered body may be formed in embodiments in a disk shape having a diameter from 10 mm up to 550 mm across a range of thicknesses, from 4 mm to 100 mm. The body may also be machined into a variety of forms and/or component shapes as needed dependent upon application. The high densities achieved according to the method as disclosed herein provide the ability to polish a surface of the cordierite sintered body to a fine surface finish. The surface roughness, Sa, as defined herein is a measure of the arithmetical mean height of a surface as known in accordance with ISO 25178 Surface Texture (Areal Roughness Measurement), a collection of international standards relating to the analysis of surface roughness. The cordierite sintered bodies as disclosed may have surface roughness Sa values of less than 18 nm, preferably less than 15 nm, preferably less than 10 nm, more preferably less than 8 nm, more preferably less than 5 nm, more preferably less than 2 nm.

The method as disclosed herein provides for an improved control over the maximum pore size, higher density, improved mechanical strength and thereby handleability of the cordierite sintered body/component in particular for those cordierite bodies of dimensions greater than, for example, between 200 to 550 mm and greater across a maximum dimension, and the reduction of oxygen vacancies in the lattice of the corrosion resistant cordierite sintered component.

Thus, in one embodiment disclosed herein is a cordierite sintered body produced by a method comprising the steps of: a) combining powders comprising silicon dioxide ($SiO_2$), magnesium oxide (MgO) and aluminum oxide ($Al_2O_3$) to form a powder mixture; b) calcining the powder mixture by applying heat to raise the temperature of the powder mixture to a calcination temperature and maintaining the calcination temperature to perform calcination to produce a calcined powder mixture; c) disposing the calcined powder mixture inside a volume defined by a tool set of a sintering apparatus and creating vacuum conditions inside the volume; d) applying pressure to the calcined powder mixture while heating to a sintering temperature and performing sintering to form the cordierite sintered body, wherein the cordierite sintered body comprises $Mg_2Al_4Si_5O_{18}$; and e) lowering the temperature of the cordierite sintered body.

All features disclosed with respect to the method of making a cordierite sintered body also apply to the product, a cordierite sintered body, and all features disclosed with respect to the product, a cordierite sintered body, also apply to the method of making a cordierite sintered body.

Use as a Photolithographic Reticle

Disclosed herein is a photolithographic reticle comprising at least one layer of a cordierite sintered body comprising $Mg_2Al_4Si_5O_{18}$ and having at least one surface, wherein the cordierite sintered body has a density of between 2.55 and 2.63 g/cc.

One exemplary use of the cordierite sintered body as disclosed is as a reflective reticle for use in EUV lithographic applications that substantially reduces or eliminates pattern distortion due to the absorption of EUV radiation, while maintaining a reticle thickness consistent with industry standards.

FIGS. 2A and B schematically depicts embodiments of an EUV reflective reticle 100 comprising substrate 102 and reflective layer 104, wherein FIG. 2B) further comprises a layer of ULE glass 206. Embodiments of the photolithographic reticles of FIGS. 2A and 2B include a substrate 102 onto which one or more layers of a highly reflective material have been disposed to form a reflective layer 104. A pattern (not shown) can be formed onto a reflective surface of layer 104 through chemical etching of a patterned layer of resist or, additionally or alternatively, through any other technique apparent to one skilled in the art. Reflective layer 104 can be formed from aluminum or other highly reflective metals selected for application-specific properties at a selected frequency of use.

Substrate 102 comprises a cordierite sintered body produced by the method disclosed herein having a coefficient of thermal expansion that is substantially zero over a range of temperatures experienced by photolithographic reticle 100. The cordierite sintered body's physical and chemical properties (e.g., very high density, low surface smoothness and absence of defects) as disclosed herein render the cordierite sintered body suitable for use as a reticle substrate providing a top surface 106 of low porosity to support polishing and an application of reflective films which are thereafter free of pores or porosity and having a low surface roughness (Sa) and low peak to valley (Sz). The surface characteristics are measured in this case as the "peak to valley" (Sz) value and the surface roughness (Sa). Without being bound by any particular theory, if the substrate top surface 106 has a sufficiently low surface roughness and peak to valley measurement (for example an Sz of about 14 nm and less and an Sa of about 10 nm and less) the reticle 100 may in certain embodiments not comprise an additional layer of a ULE glass layer disposed between the substrate top surface and the at least one reflective layer 104, or a ULE glass layer atop the reflective layer. A cordierite sintered body which may be polished to a peak to valley feature within the ranges as disclosed herein may provide a reflective reticle having decreased thermal resistance, and thereby less pattern distortion upon heating. In embodiments this layer may have a minimal thickness in order to maintain a relatively low thermal resistance, such as for example less than 0.025 mm in thickness. For example, U.S. Pat. No. 8,736,810 discloses that microstructural defects (voids) render cordierite unsuitable for use as a substrate in a reflective reticle so an additional layer of material is needed between the reflective layer and the substrate. That additional material layer can be, for example, a metallic layer, including, but not limited to aluminum, a non-metallic conducting material, such as graphite, or any combination thereof. In contrast, an EUV reflective reticle according to the disclosure consists of a substrate comprising a cordierite sintered body as disclosed herein and at least one layer of a highly reflective material forming a reflective layer. The substrate comprising a cordierite sintered body as disclosed herein does not suffer from the drawbacks associated with pattern distortion resulting from localized heating due to absorbed radiation and exhibits the surface properties to allow a highly reflective material to be disposed directly thereon a surface of the substrate.

The cordierite sintered body substrate 102 has a substantially-zero coefficient of thermal expansion over the range of ambient temperature (about 22° C. to 25° C.) and which also has a thermal conductivity approximately three times larger than that of the optical layer (e.g., cordierite has a thermal conductivity of from about 3.8 to about 5 W/(m-° C.) at 25° C., and ULE glass has a thermal conductivity of about 1.31 W/(m-° C.) at 25° C.). In an embodiment, a thickness of substrate 102 can be about 5.00 mm and greater.

In order to maintain high exposure precision, the patterning device 100 and/or wafer 80 are supported by first and second support platforms, 82 and 84. First support platform 82 (as depicted in FIG. 1) may comprise a frame, structure or support which is either fixed or moveable. Embodiments of a support chuck and a support structure 82 and 84 are depicted in FIGS. 3A and B.

Use as a Support Structure

Figure 3:
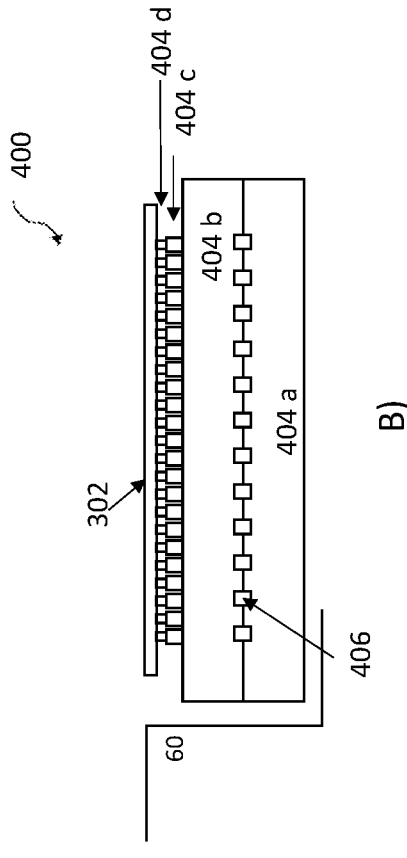
FIG. 3 illustrates exemplary embodiments of supporting structures as disclosed herein.
Figure 3:
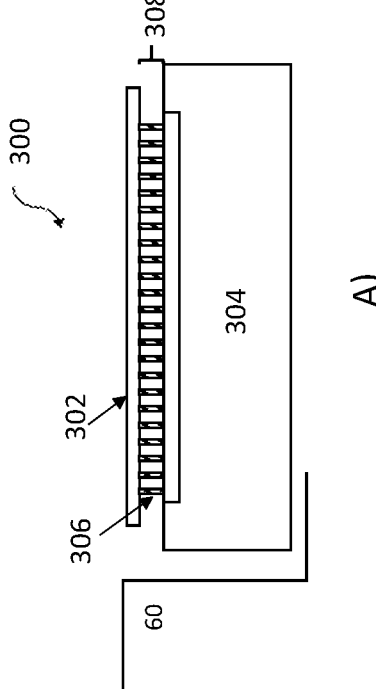

Another exemplary use of the cordierite sintered body as disclosed is as a support chuck or a support structure (as depicted in FIGS. 3A and B, respectively) for use in EUV lithographic applications that substantially reduces or eliminates pattern distortion and positional variations due to the absorption of EUV radiation. The support structure and/or support chuck may comprise at least one layer of a cordierite sintered body comprising $Mg_2Al_4Si_5O_{18}$ and having at least one surface, wherein the cordierite sintered body has a density of between 2.55 and 2.63 g/cc.

FIG. 3A) depicts an exemplary cross-sectional view of a support chuck 300 which may in some embodiments comprise an electrostatic chuck configured to support a component 302 (which may comprise the patterning device 100 or wafer 80 mounted thereon, without limitation). According to certain illustrative examples, the support chuck 300 includes a chuck substrate 304 and in certain embodiments where support chuck 300 has an electrostatic clamping function, chuck substrate 304 may further comprise a built-in charging plate 306 operable to be charged for applying static electrical force to the component 302. In some embodiments, the support chuck 300 may be mounted upon first or second support platforms, 82 and 84. The support chuck 300 further includes a number of support pins 308 designed to support the component 302 and leave a space between the component 302 and the chuck substrate 304 (and the charging plate 306 where applicable) such that a gas may flow between them to reduce the clamping effect. Receptacle 60 may be provided in first and second support structures (82 and 84 respectively) such that its top surface is coplanar with top surface of component 302.

FIG. 3B depicts an exemplary cross-sectional view of a support structure 400. According to certain illustrative examples, the support structure 400 supports a component 302 (which may in some embodiments may comprise the patterning device 100 or wafer 80 without limitation) mounted thereon and further includes composite substrates 404a to d. The support structure 400 comprises a first lower component 404a which is bonded to a second lower component 404b (by for example soldering, diffusion bonding and similar methods as known to those skilled in the art), both jointly forming the base body ("bulk") of the support structure 400. Support structure 400 may have a plurality of channels 406 for removing heat which occurs more intensively as a result of the absorption of radiation in the composite substrates 404a to 404d at high beam intensities in microlithography. Support structure 400 further comprises upper support structures (404c and 404d) to support the component 302. These structures each comprise a first upper structure 404c and a second upper structure 404d. Upper support structures provide high precision during exposure through controlled positional change during EUV exposure.

It is understood that further channels 406, e.g. for receiving built-in components or heating elements, can also be provided in the support structure 400 (or alternatively in chuck substrate 304 of support chuck 300) and that this can also be provided with a mesh or honeycomb structure, for example, as described above to achieve an additional reduction in weight while maintaining high rigidity.

The support chuck 300 and the support structure 400 thus formed can withstand the high beam intensities in microlithography, whereby a lightweight structure is achieved through the type of selected components and at the same time, good heat transfer and a low thermal expansion are ensured and the high Young's modulus provides a high mechanical stability and positional accuracy. It is possible to form the support chuck 300 and/or the support structure 400 either as a composite structure (in such shapes as a honeycomb or mesh pattern) or as a monolithic block of cordierite.

The chuck substrate 304 and composite substrates 404*a* to *d* preferably comprise the cordierite sintered body as disclosed herein.

Apparatus/Spark Plasma Sintering Tool

Disclosed herein is a spark plasma sintering (SPS) tool comprising: a die comprising a sidewall comprising an inner wall and an outer wall, wherein the inner wall has a diameter that defines an inner volume capable of receiving at least one ceramic powder; and an upper punch and a lower punch operably coupled with the die, wherein each of the upper punch and the lower punch have an outer wall defining a diameter that is less than the diameter of the inner wall of the die thereby creating a gap between each of the upper punch and the lower punch and the inner wall of the die when at least one of the upper punch and the lower punch are moved within the inner volume of the die, wherein the gap is from 10 μm to 100 μm wide and the at least one ceramic powder has a specific surface area (SSA) of from 1 to 18 m/g as measured according to ASTM C1274.

Figure 10:
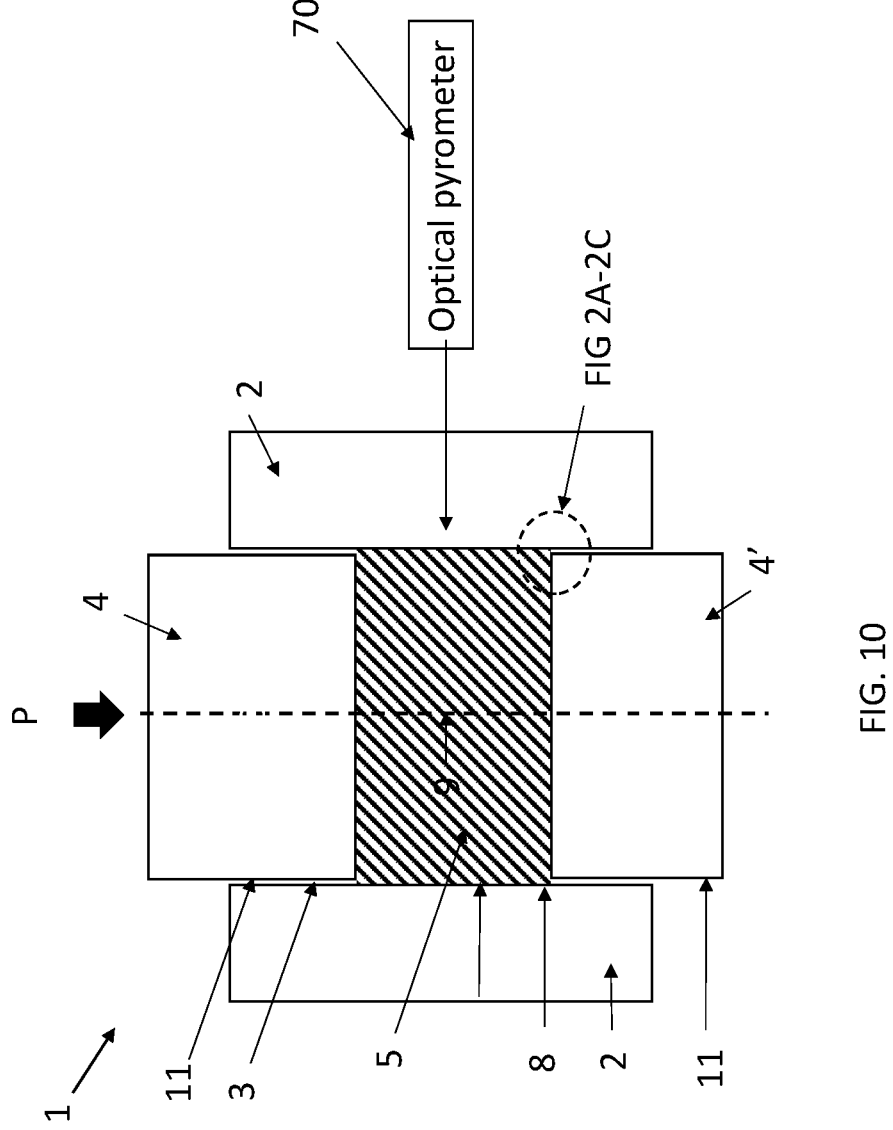
FIG. 10 is a cross-sectional view of an SPS sintering apparatus having a tool set located in a vacuum chamber (not shown) with a simple arrangement used for sintering ceramic materials.

FIG. 10 depicts an SPS tool 1 with a simplified die/punch arrangement used for sintering ceramic powders to make large sintered ceramic bodies as disclosed herein. The terms "apparatus" and "tool" are used interchangeably in reference to the spark plasma sintering apparatus.

Typically, the die/punch arrangement is within a vacuum chamber (not shown) as will be recognized by one of ordinary skill in the art. Referring to FIG. 10, the spark plasma sintering tool 1 comprises a die system 2 comprising a sidewall comprising an inner wall 8 having a diameter that defines an inner volume capable of receiving at least one ceramic powder 5.

Still referring to FIG. 10, the spark plasma sintering tool 1 comprises an upper punch 4 and a lower punch 4' operably coupled with the die system 2, wherein each of the upper punch 4 and the lower punch 4' have an outer wall 11 defining a diameter that is less than the diameter of the inner wall 8 of the die system 2 thereby creating a gap 3 between each of the upper punch 4 and the lower punch 4' and the inner wall 8 of the die system 2 when at least one of the upper punch 4 and the lower punch 4' are moved within the inner volume of the die system 2.

The die system 2 and upper 4 and lower 4' punches may comprise at least one graphite material. In certain embodiments, the graphite material/s disclosed herein may comprise at least one isotropic graphite material. In other embodiments, the graphite material/s disclosed herein may comprise at least one reinforced graphite material such as for example a carbon-carbon composite, and graphite materials comprising fibers, particles or sheets or mesh or laminates of other electrically conductive materials such as carbon in a matrix of an isotropic graphite material. In other embodiments, the die and upper and lower punches may comprise combinations of these isotropic and reinforced graphite materials.

The graphite materials used for some or all of the parts of the tool such as, for example, die 6 and punches 4 and 4' may comprise porous graphite materials which exhibit a porosity of from about 5% to about 20%, from about 5% to about 17%, from about 5% to about 13%, from about 5% to about 10%, from 5% to about 8%, from about 8% to about 20%, from about 12% to 20%, from about 15% to about 20%, from about 11% to about 20%, from about 5% to 15%, from 6% to about 13%, and preferably from about 7% to about 12%.

Preferably, the graphite material has an average pore size (pore diameter) of from 0.4 to 5.0 μm, preferably from 1.0 to 4.0 μm and comprises pores with a surface pore diameter of up to 30 μm, preferably up to 20 μm, preferably up to 10 μm. More preferably, pores with a surface pore diameter of from 10 to 30 μm may be present.

The graphite materials used for the tool as disclosed herein may have an average grain size of <0.05 mm, preferably <0.04 mm, preferably <0.03 mm, preferably <0.028 mm, preferably <0.025 mm, preferably <0.02 mm, preferably <0.018 mm, preferably <0.015 mm, and preferably <0.010 mm.

The graphite materials used for the tool as disclosed herein may have an average grain size of >0.001 mm, preferably >0.003 mm, preferably >0.006 mm, preferably >0.008 mm, preferably >0.010 mm, preferably >0.012 mm, preferably >0.014 mm, preferably >0.020 mm preferably >0.025 mm and preferably >0.030 mm.

The graphite materials used for the tool as disclosed herein may have a density of $\geq 1.45$ g/cm$^3$, preferably $\geq 1.50$ g/cm$^3$, preferably $\geq 1.55$ g/cm$^3$, preferably $\geq 1.60$ g/cm$^3$, preferably $\geq 1.65$ g/cm$^3$, preferably $\geq 1.70$ g/cm$^3$, and preferably $\geq 1.75$ g/cm$^3$.

The graphite materials used for the tool as disclosed herein may have a density of $\leq 1.90$ g/cm$^3$, preferably $\leq 1.85$ g/cm$^3$ and preferably $\leq 1.80$ g/cm$^3$.

In embodiments, the graphite materials have a coefficient of thermal expansion (CTE) across a temperature range from about 400 to about 1400° C. of $\geq 3.3 \times 10^{-6}$/° C., $\geq 3.5 \times 10^{-6}$/° C., $\geq 3.7 \times 10^{-6}$/° C., $\geq 4.0 \times 10^{-6}$/° C., $\geq 4.2 \times 10^{-6}$/° C., $\geq 4.4 \times 10^{-6}$/° C., $\geq 4.6 \times 10^{-6}$/° C., $\geq 4.8 \times 10^{-6}$/° C.

In embodiments, the graphite materials may have a coefficient of thermal expansion (CTE) across a temperature range from about 400 to 1400° C. of $\leq 7.0 \times 10^{-6}$/° C., preferably $\leq 6.0 \times 10^{-6}$/° C., preferably $\leq 5.0 \times 10^{-6}$/° C., preferably $\leq 4.8 \times 10^{-6}$/° C., preferably $\leq 4.6 \times 10^{-6}$/° C.

Table 6 lists properties of exemplary graphite materials as disclosed herein.

TABLE 6

| Property | Range |
| --- | --- |
| Density (g/cc) | 1.45 to 1.9 |
| Average Grain Size (um) | 1 to <50 |
| Resistivity (Ohm-cm) | 0.001 to 0.003 |
| Flexural Strength (MPa) | 40-160 |
| Compressive Strength (MPa) | 80-260 |
| CTE (×10⁻⁶/C.) at 400° C. to 1400° C. | 3.3 to 7 |
| Porosity % | 5 to 20 |
| Average Pore Diameter (um) | 0.4 to 5 |
| Thermal K (W/m K) | 40-130 |
| Shore Hardness (HSD) | 55 to 59 |
| Tensile Strength (MPa) | 25 to 30 |
| Elastic Modulus (GPa) | 9 to 11 |
| Impurities/Ash (ppm) | 3 to 500 |

Figure 11A:
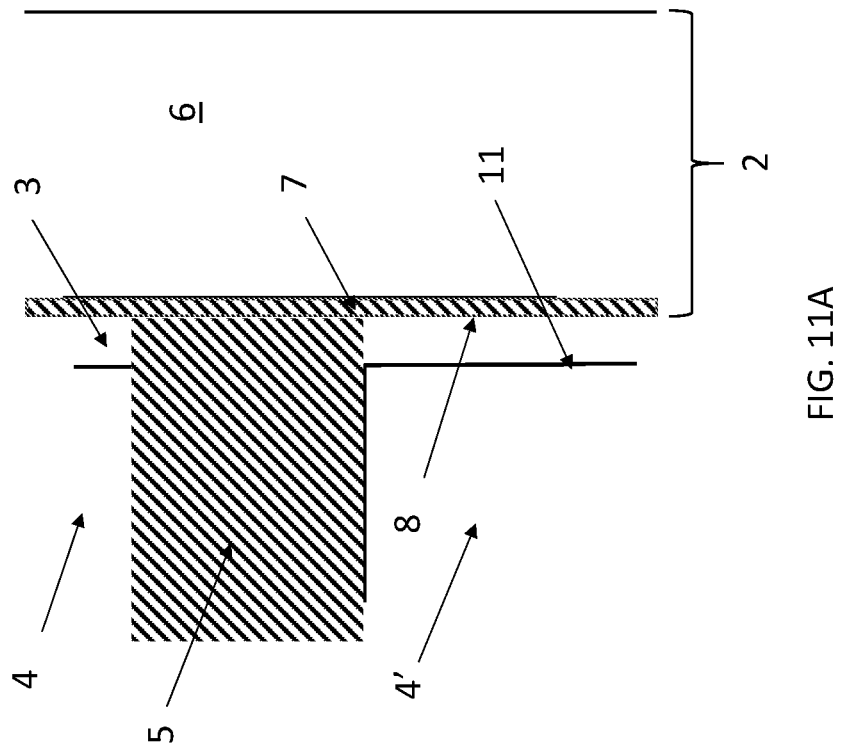
FIG. 11A illustrates an embodiment of FIG. 10 showing one foil layer.
Figure 11B:
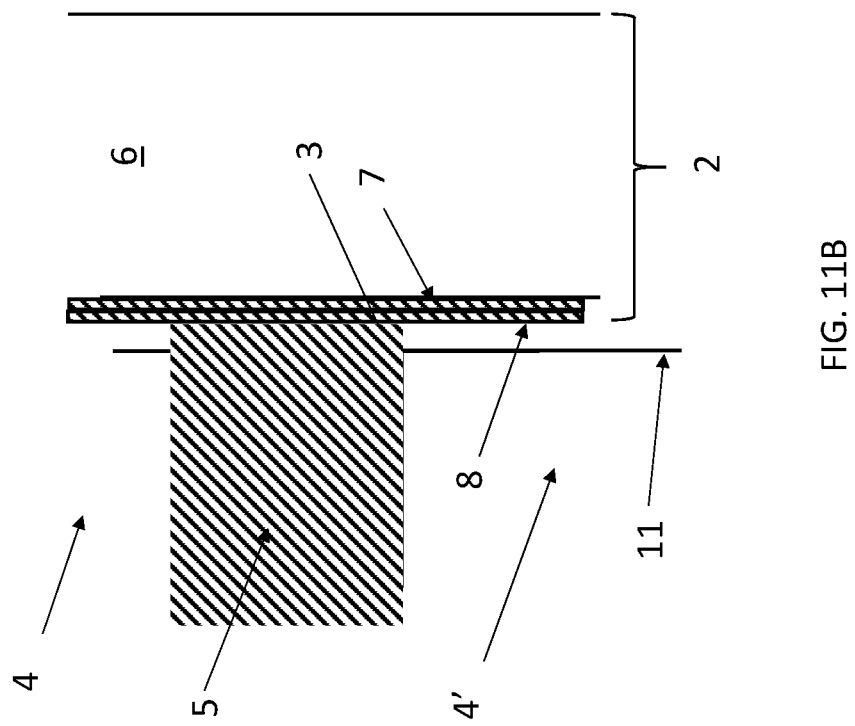
FIG. 11B illustrates an alternative embodiment of FIG. 10 showing two foil layers.
Figure 11C:
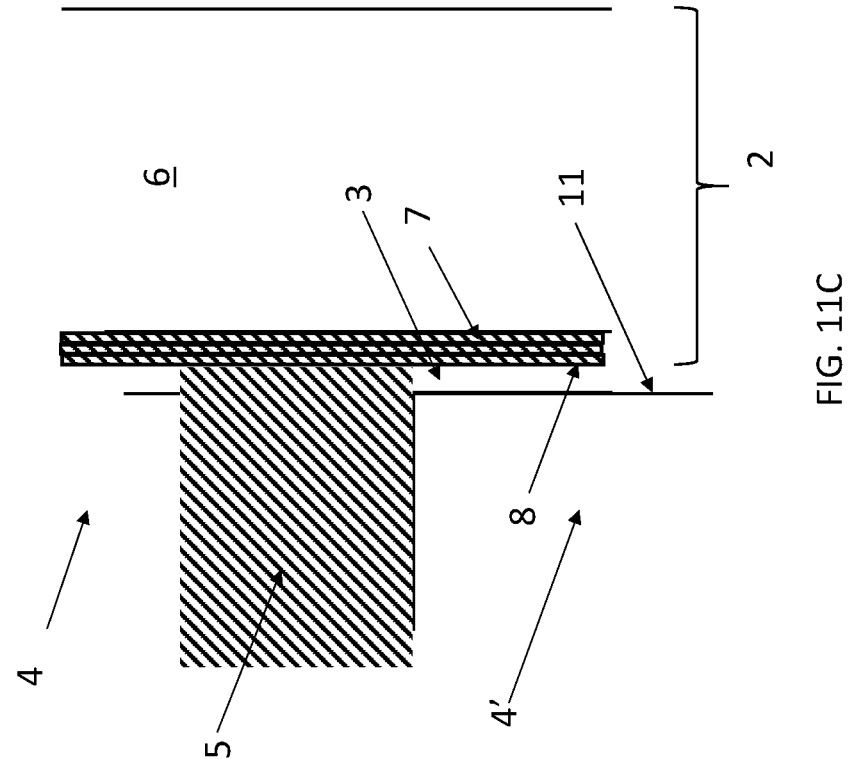
FIG. 11C illustrates another alternative embodiment of FIG. 10 showing three foil layers.

The die system 2 comprises a die 6 and optionally but preferably at least one conductive foil 7 located on the inner wall of the die as depicted in the embodiments of FIGS. 11A to 11C. The number of conductive foils on the inner wall of the die is not limited and 1, 2, 3, 4, 5, 6, 7, 8, 9, or 10 conductive foils may be provided as a circumferential liner between die 6 and each of upper 4 and lower 4' punches whereby the inner wall 8 of the die system 2 (including the at least one conductive foil, if present) and the outer wall 11 of each of the upper and lower punches defines the gap 3. The at least one conductive foil 7 may comprise graphite, niobium, nickel, molybdenum, platinum and other ductile, conductive materials and combinations thereof which are stable within the temperature range according to the method as disclosed herein.

In certain embodiments, the conductive foil may comprise a flexible and compressible graphite foil as disclosed herein having one or more of the following characteristics:

carbon content of more than 99 wt %, preferably more than 99.2 wt %, more preferably more than 99.4 wt %, more preferably more than 99.6 wt %, more preferably more than 99.8 wt %, more preferably more than 99.9 wt %, more preferably more than 99.99 wt %, and more preferably more than 99.999 wt %;

impurities of less than 500 ppm, preferably less than 400 ppm, more preferably less than 300 ppm, more preferably less than 200 ppm, more preferably less than 100 ppm, more preferably less than 50 ppm, more preferably less than 10 ppm, more preferably less than 5 ppm, and more preferably less than 3 ppm;

tensile strength of the graphite foil in a range of from 4.0 to 6.0 MPa, preferably from 4.2 to 5.8 MPa, and more preferably from 4.4 or 5.6 MPa; and/or bulk density of the graphite foil preferably in a range of from 1.0 to 1.2 g/cc, preferably 1.02 to 1.18 g/cc, more preferably 1.04 to 1.16 g/cc, and more preferably 1.06 to 1.16 g/cc.

In embodiments, the at least one foil typically comprises graphite. In certain embodiments, the at least one foil as part of the die system may comprise a circumferential liner between a surface of the die and each of the upper and lower punches.

The graphite foils may improve the temperature distribution across the powder during sintering.

TABLE 7

| | |
|---|---|
| Thickness (mm) | 0.030 to 0.260 |
| Density (Mg/m3) | 0.5 to 2 |
| Tensile Strength (MPa) | 4.9-6.3 |
| Resistivity ($\mu$Ohm-m; 25° C.) (parallel to surface) | 5 to 10 |
| Resistivity ($\mu$Ohm-m; 25° C.) (perpendicular to surface) | 900 to 1100 |
| CTE ($\times 10 - 6$/C.; parallel to surface) at 350° C. to 500° C. | 5 to 5.5 |
| CTE (perpendicular to surface) at 350° C. to 500° C. | $2 \times 10^{-4}$ |
| Compressibility (%) | 40-50 |
| Recovery (%) | 10 to 20 |
| thermal conductivity (W/mK at 25° C.; parallel to surface) | 175 to 225 |
| thermal conductivity (W/mK at 25° C.; perpendicular to surface) | ~5 |
| Impurities/Ash (wt %) | <0.5 |

Referring now to FIGS. 11A, 11B and 11C, an SPS tool set with embodiments of the graphite foil arrangement is shown. A ceramic powder 5 is disposed between at least one of upper and lower punches 4 and 4' and gap 3 is shown between the outer wall 11 of each of the upper and lower punches and the inner wall 8 of the die system 2. FIGS. 11A, 11B and 11C depict 1 to 3 layers of conductive foil 7 respectively and die 6 as part of the die system 2. Accordingly, the gap extends from the inner wall 8 of the die system 2 to the outer wall 11 of each of the upper and lower punches. The gap distance is arranged such that the powder may degas before and/or during heating and sintering, while also maintaining ohmic contact between punch and die to improve the temperature distribution across the ceramic powder during heating and sintering.

The graphite foils may have a thickness of, for example, from 0.025 to 0.260 mm, preferably from 0.025 to 0.200 mm, preferably from 0.025 to 0.175 mm, preferably from 0.025 to 0.150 mm, preferably from 0.025 to 0.125 mm, preferably from 0.035 to 0.200 mm, preferably from 0.045 to 0.200 mm, and preferably from 0.055 to 0.200 mm.

The distance of gap 3 is measured from an inwardly facing surface of the foil 7 closest to the upper and lower punches 4 and 4' to the outer wall 11 of each of the upper and lower punches. Preferred ranges for the distance of gap 3 are preferably from 10 to 100 $\mu$m, preferably from 10 to 80 $\mu$m, preferably from 10 to 70 $\mu$m, preferably from 10 to 60 $\mu$m, preferably from 10 to 50 $\mu$m, preferably from 30 to 70 $\mu$m, preferably from 20 to 60 um, and preferably from 30 to 60 $\mu$m.

Moreover, the width of gap 3 between the inner wall 8 of the die system 2 and the outer wall 11 of each of the upper 4 and lower 4' punches may be determined by the person skilled in the art so that the powder degassing during the preheating, heating and sintering processes are sufficiently facilitated on one hand and that a sufficient electrical contact for Joule or resistive heating and, thereby, sintering is achieved on the other hand. If the distance of gap 3 is less than 10 $\mu$m, the force required to move at least one of the upper and lower punches within the inner volume of the die system, and thereby assemble the tool set, may cause damage to the tool set. Further, a gap 3 of less than 10 um may not allow for escape of adsorbed gases, organics, humidity and the like within the ceramic powder 5 which would extend processing time during manufacturing and may result in residual porosity, and thereby lowered density, in the cordierite sintered body. In certain embodiments, if the width of gap 3 is greater than about 70 $\mu$m when sintering insulating materials, such as the powder mixtures and/or the calcined powder mixtures as disclosed herein, localized overheating may occur resulting in thermal gradients within the tool set during sintering. These thermal gradients (which may result from the high resistivity of the oxide powder mixtures, for example resistivity of about $1 \times 10^{+10}$ ohm-cm and greater) may result in differences in density across the cordierite sintered body. To form a cordierite sintered body of a large dimension from the powder mixtures and calcined powder mixtures as disclosed herein, a gap of from 10 to 70 um is preferable. Thus, in some embodiments, the distance of the gap 3 between the inner wall 8 of the die system 2 and the outer wall 11 of each of the upper and lower punches when sintering ceramic powders comprising the oxide powder mixtures is preferably from 10 to 70 $\mu$m, preferably from 10 to 60 $\mu$m, preferably from 10 to 50 $\mu$m, preferably from 10 to 40 $\mu$m, preferably from 20 to 70 $\mu$m, preferably from 30 to 70 $\mu$m, preferably from 40 to 70 $\mu$m, preferably from 50 to 70 um, preferably from 30 to 60 $\mu$m. Without intending to be bound by a particular theory, it is believed that the gap distance between the the inner wall 8 of the die system 2 and the outer wall 11 of each of the upper and lower punches during sintering functions to facilitate powder degassing of organics, moisture, adsorbed molecules, etc. during the pre-sintering and sintering processes. This leads to a cordierite sintered body of a large size having high density and low volumetric porosity, low density variation and improved mechanical properties such that the body may be easily handled without breakage. Sintered ceramic bodies comprising cordierite made as disclosed herein may have dimensions of from 100 mm to 622 mm or greater with regard to the greatest dimension of the cordierite sintered body.

Figure 12B:
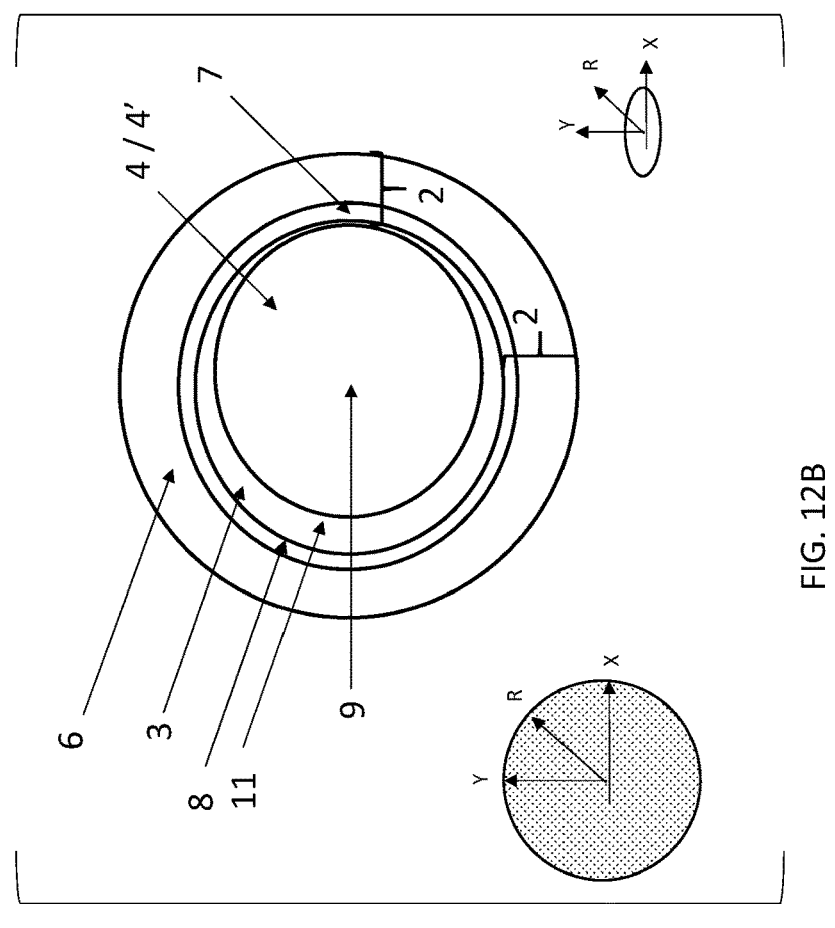
FIGS. 12A and 12B are top plan views of the SPS sintering apparatus of FIG. 10.
Figure 12A:
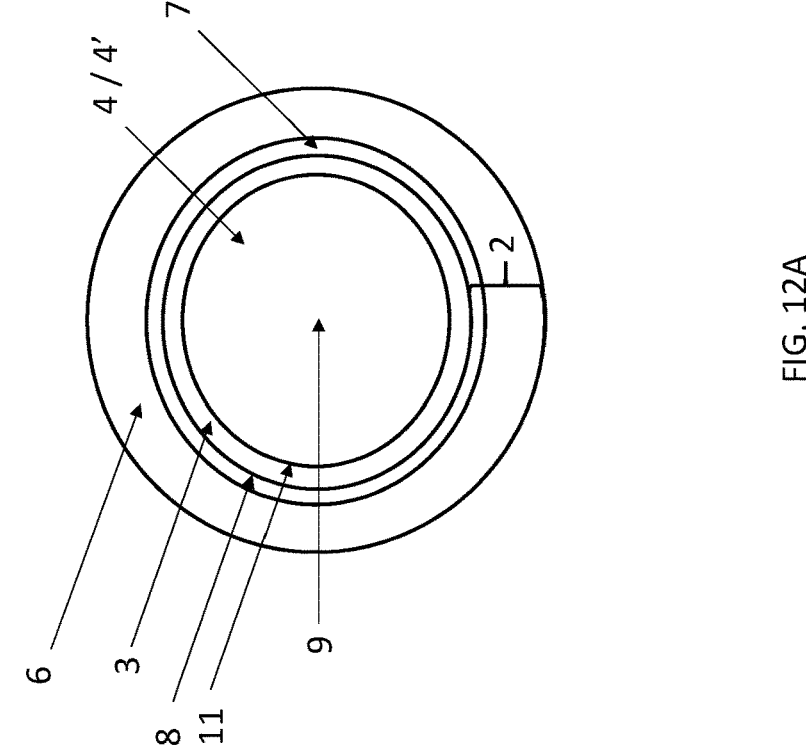

In practice, the upper and lower punches 4 and 4' are not always perfectly aligned about a central axis. FIG. 12A and FIG. 12B are plan views of the tool set 1, illustrating alignments of upper and lower punches 4 and 4', gap 3, any number of conductive foils 7, and die system 2 about central axis 9. In embodiments as depicted in FIG. 12A, the gap may be axisymmetric about central axis 9. In other embodiments as depicted in FIG. 12B, the gap may be asymmetric about central axis, 9. The gap 3 may extend between from 10 um to 70 um when sintering the oxide ceramics as disclosed herein, in both axisymmetric and asymmetric embodiments as depicted.

Figure 13:
FIG. 13 is a graph depicting radial variance in average coefficient of thermal expansion (CTE) of graphite materials A and B at 1200° C.
Figure 13:
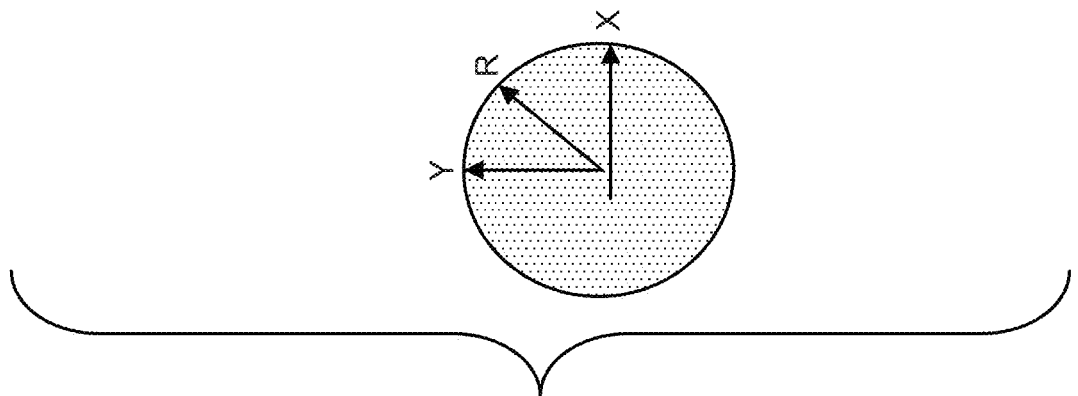
Figures 14A, 14B:
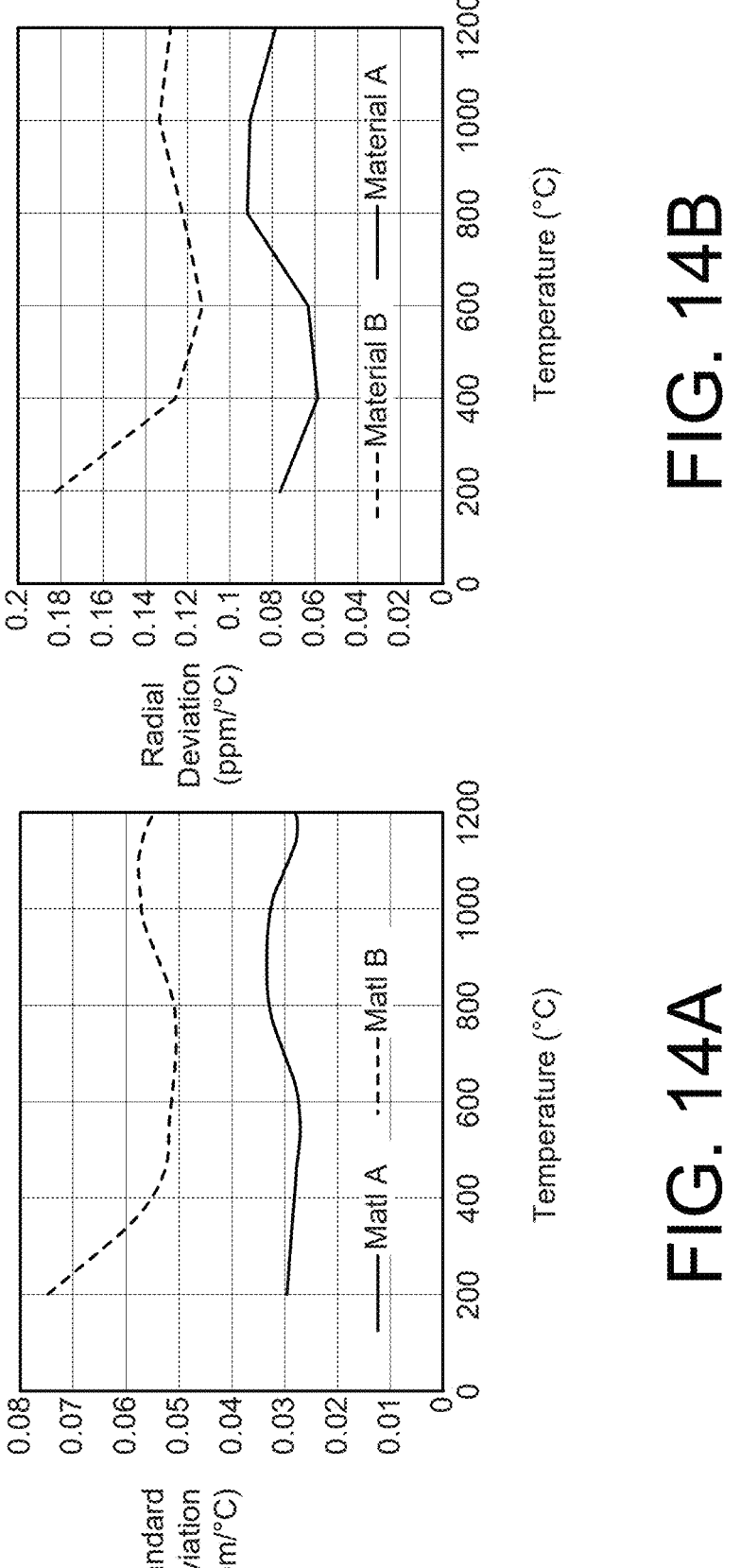
FIG. 14 A) illustrates the standard deviation of coefficient of thermal expansion of graphite materials A and B in ppm, and B) radial deviation (absolute variation) in coefficient of thermal expansion of graphite materials A and B each as measured over the operating temperatures of 200 to 1200° C.
Figure 15:
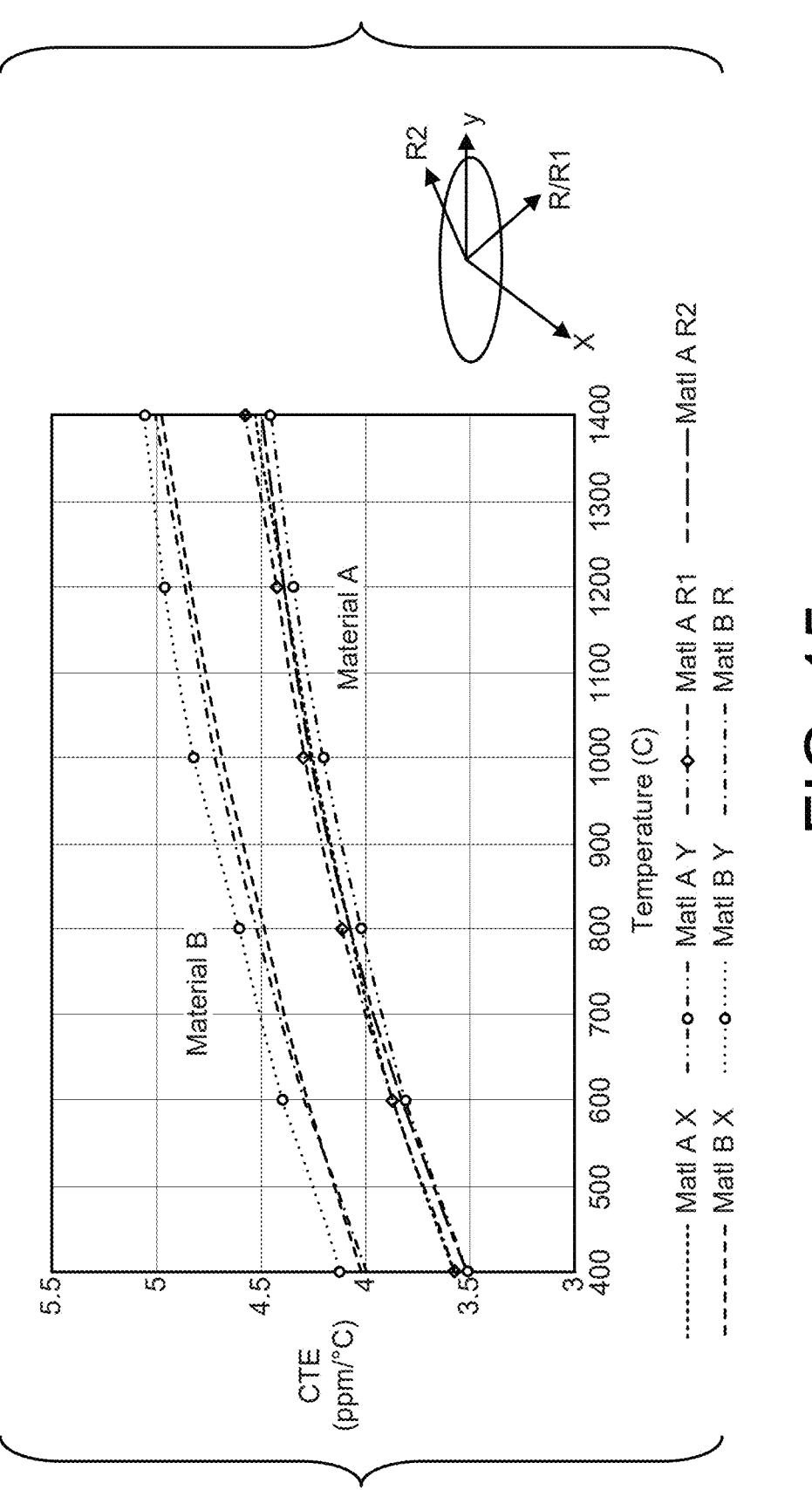
FIG. 15 is a graph illustrating the coefficient of thermal expansion of graphite materials A and B from 400 to 1400° C.

Gap asymmetry performance can be measured by performing an absolute radial CTE deviation analysis over a range of temperatures. For example, FIG. 13 shows the radial deviation from average CTE of two isotropic graphite materials (A and B) used as the punches and die of the apparatus disclosed herein at 1200° C. FIG. 13 shows that for a material to be successful at maintaining the desired gap over a large temperature range, the radial deviation cannot vary in the x-y plane by $>0.3 \times 10^{-6}$ ppm/° C. at the maximum from, e.g., room temperature to 2000° C. Material B displays an unacceptable CTE expansion in the x-y plane whereas Material A exhibited an acceptable CTE expansion throughout the temperature range. FIG. 14A) shows the standard deviation of CTE in ppm/° C. of the graphite materials A and B, and B) the absolute radial variation (delta) in CTE (from lowest to highest) across the x-y plane of both materials of FIG. 13 across the range of temperatures. FIG. 15 depicts variance in coefficient of thermal expansion of graphite materials A and B from 400 to 1400° C.

The sintering apparatus and procedures are disclosed in U.S. provisional patent application 63/124,547, which is incorporated herein by reference.

The advantages of the specific tool set design used according to an embodiment may lead to the overall technical effect to provide a large ceramic body of very high purity (the use of dopants and/or sintering aids is not required) having a high and uniform density and low volumetric porosity and thereby a reduced tendency towards breakage in the sintering process, in particular in the SPS process, according to the present disclosure. Therefore, all features disclosed with respect to the tool set also apply to the product of a cordierite sintered body of dimension greater than 100 mm, preferably from 100 mm to about 622 mm.

By using the tool set as disclosed herein it becomes possible to achieve a more homogeneous temperature distribution in the powder to be sintered, and make a cordierite sintered body, in particular one of large dimension, exceeding for example 100 mm and/or 200 mm in greatest dimension, having very high (>96% of theoretical density of cordierite as disclosed herein) and uniform density (<4% variation across a greatest dimension) and thereby a reduced tendency towards breakage.

The tool set as disclosed may further comprise spacer elements, shims, liners and other tool set components. Typically, such components are fabricated from at least one of the graphite materials having the properties as disclosed herein.

The cordierite sintered bodies as disclosed herein having the combined properties of crystal phase purity, high (chemical) purity, low volumetric porosity (and correspondingly high density) and high thermal conductivity provide the synergistic effect of controlled coefficient of thermal expansion, high elastic modulus, high thermal conductivity and a polished surface which is substantially smooth and free of porosity when used as components in a lithographic apparatus, and in particular EUV lithography, as disclosed herein. Using the spark plasma sintering apparatus as disclosed herein, these beneficial features may be provided in a cordierite sintered body of large dimension, in particular from 100 mm to more than 600 mm in diameter.

The features and advantages are more fully shown by the illustrative examples discussed below.

EXAMPLES

The following examples are included to more clearly demonstrate the overall nature of the disclosure. These examples are exemplary, not restrictive, of the disclosure.

All particle size measurements were performed using a Horiba model LA-960 Laser Scattering Particle Size Distribution Analyzer capable of measuring particle size from 10 nm to 5 mm. All specific surface area (SSA) measurements for the starting powders, powder mixtures, and calcined powder mixtures were performed using a Horiba BET Surface Area Analyzer model SA-9601 capable of measuring across a specific surface area of 0.01 to 2000 m²/g with an accuracy of 10% and less for most samples. Purities and impurities were measured using an ICP-MS from Agilent 7900 ICP-MS model G8403.

Comparator Example One: Sample 003 Ball Milling

A powder mixture was made comprising powders of alumina, magnesia and silica combined in relative amounts to form phase pure cordierite crystal phase upon sintering. The alumina powder had a specific surface area (SSA) of about 24 m²/g, a particle size distribution having a d10 of about 0.12 um, a d50 of about 0.67 um, a d90 of about 2.89 um, and a purity of 99.9985% relative to an alumina powder having 100% purity. The powder of magnesia had a specific surface area of about 4 m²/g, a particle size distribution having a d10 of about 0.14 um, a d50 of about 3.3 um, a d90 of about 6.5 um, and a purity of 99.7966% relative to 100% pure magnesia. The silica powder comprised a pyrogenic silica granulate which may be formed by spray drying pyrogenic silica powder, resulting in agglomeration of primary particles into larger agglomerates or crystallites, to produce the silica granulate. The silica granulate comprises particles which may be both spherical and non-spherical. Measurements using the Laser Scattering Particle Size Distribution Analyzer as disclosed herein is based upon the assumption of a substantially spherical particle shape. As such, results using the Laser Scattering Particle Size Distribution methods as disclosed herein may not provide sufficient accuracy when measuring the silica granulate. As such, particle sizes as reported for the silica granulate as disclosed herein are as reported in the literature. The silica granulate as disclosed herein may have a specific surface area of from 20 to 40 m²/g, and a particle size distribution having a d50 of from 200 to 250 um, and a purity of greater than 99.999% relative to 100% purity silica. The cordierite sintered body made with the silica granulate in accordance with this example having the particle size distribution as disclosed indicates powder agglomeration, resulting in large particle sizes for d50. This d50 particle size resulted in localized microcracking upon sintering due to CTE mismatches between phases in the sintered ceramic. Use of less agglomerated starting powders having smaller d50 particle sizes, combined with milling of sufficient energy may provide more uniform and smaller particle size distributions as disclosed herein and remedy such microcracking. A silica powder having a particle size distribution with a d10 of from 0.03 to 0.3 µm, a d50 of from 0.2 to 5 µm, and a d90 of from 40 to 120 µm and an SSA of from 20 to 40 m²/g is preferable. The powders were weighed and combined to create the powder mixture in a molar ratio to form the cordierite phase upon sintering. The powder mixture was then transferred to a container for ball milling. Ethanol in an amount of 120% relative to powder weight was added to the powder mixture to form a slurry, and mixing media at 100% relative to powder weight was added to facilitate mixing among the powders comprising the powder mixture. After 24 hours of mixing, the slurry containing the powder mixture was removed from the mixer and the ethanol was extracted from the slurry using a rotary evaporator. Thereafter calcination was performed at 600° C. for 8 hours on the powder mixture. Calcination may reduce moisture content, increase crystallinity and in some instances provide a decrease in surface area. The calcined powder mixture may be optionally sieved, tumbled, blended, etc. according to known methods after calcination. The calcined powder mixture had a surface area of 23-27 $m^2/g$, a particle size distribution having a d10 of about 2 um, a d50 of about 10 um, a d90 of about 87 um, and a purity of 99.986%. The powder mixture may be optionally sieved, blended, milled, etc. either before or after calcination. The calcined powder mixture was then sintered at a temperature of 1200° C., a pressure of 30 MPa for a duration of 30 minutes under vacuum in accordance with the method as disclosed herein. An average density across five measurements was measured using the Archimedes method to be 2.62 g/cc or 98.5% of theoretical density. The standard deviation was 0.002 g/cc. Correspondingly, a volumetric or bulk porosity of 1.5% is calculated from the density measurements. FIG. 5 illustrates an SEM micrograph of the cordierite sintered body in accordance with this example. Silica rich regions (comprising silica rich quartz phases such as cristobalite and/or tridymite for example) in the microstructure resulted in localized variance in the coefficient of thermal expansion (CTE) and subsequent microcracking upon sintering as well as residual, silica rich phases of quartz, such as tridymite or cristobalite, as depicted in the XRD pattern of FIG. 4 (encircled). Thus, to reduce or eliminate silica rich regions in the sintered body and prevent microcracking, it is preferable to have a starting powder of silica having a primary particle size of about 100 nm, and a d50 of about 9 um and less, and further a mixing/milling process which provides a calcined powder mixture having a d90 particle size as small as possible, from 10 to 75 μm, preferably less than 70 um, and an SSA of from 8 to 20 $m^2/g$.

Comparator Example Two: Sample 018 Ball Milling and Planetary Milling

A powder mixture was made comprising powders of alumina, magnesia and silica. The alumina powder had a surface area of 22-26 $m^2/g$, a particle size distribution having a d10 of about 0.12 um, a d50 of about 0.67 um, a d90 of about 2.89 um, and a purity of 99.9985% relative to an alumina powder having 100% purity. The powder of magnesia had a surface area of about 4 $m^2/g$, a particle size distribution having a d10 of about 0.14 um, a d50 of about 3.33 um, a d90 of about 6.49 um, and a purity of 99.7966% relative to 100% pure Magnesia. The silica powder comprised a pyrogenic silica granulate which may be formed by spray drying pyrogenic silica powder, resulting in agglomeration of primary particles into larger agglomerates or crystallites, to produce the pyrogenic silica granulate. The silica granulate comprises particles which may comprise both spherical and non-spherical particles in varying amounts. Measurements using the Laser Scattering Particle Size Distribution Analyzer as disclosed herein is based upon the assumption of a substantially spherical particle shape. As such, results using the Laser Scattering Particle Size Distribution methods as disclosed herein may not provide sufficient accuracy when measuring the silica granulate. As such, particle sizes as reported for the silica granulate as disclosed herein are as reported in the literature. The silica granulate as disclosed herein may have a specific surface area of from 20 to 40 $m^2/g$, and a particle size distribution having a d50 of from 200 to 250 um, and a purity of greater than 99.999% relative to 100% purity silica. The powders were weighed and combined to create the powder mixture in a molar ratio to form the cordierite phase upon sintering. The powder mixture was then transferred to a container for ball milling. Ethanol in an amount of 120% relative to powder weight was added to the powder mixture to form a slurry, and mixing media at 100% relative to powder weight was added to facilitate mixing among the powders comprising the powder mixture. The slurry was ball milled for 16 hours and the ethanol was extracted from the slurry using rotary evaporation as known to those skilled in the art. After drying, the powder mixture was subjected to planetary milling as known to those skilled in the art for a duration of 30 minutes. Thereafter calcination was performed at 600° C. for 8 hours on the powder mixture. Calcination may reduce moisture content, increase crystallinity and in some instances provide a decrease in surface area. The powder mixture may be optionally sieved, blended, milled, etc. either before or after calcination. The calcined powder mixture had a surface area of 23-27 $m^2/g$, a particle size distribution having a d10 of about 1.5 um, a d50 of about 13 um, a d90 of about 85 um, and a purity of 99.7365%. The calcined powder mixture was then sintered at a temperature of 1180° C., a pressure of 30 MPa for a duration of 30 minutes under vacuum in accordance with the method as disclosed herein. An average density across five measurements was measured using the Archimedes method to be 2.62 g/cc or 98.5% of theoretical density. Regions comprising silica evident in the microstructure resulted in variance in the coefficient of thermal expansion and subsequent microcracking similar to that depicted in FIG. 5. Thus, to reduce or eliminate silica rich regions in the sintered body and prevent microcracking, it may be preferable to have a starting powder of silica having a primary particle size of about 100 nm, and a d50 of about 9 um and less, and further a mixing/milling process which provides a calcined powder mixture having a d90 particle size as small as possible, from 10 to 75 μm, preferably less than 70 um, and an SSA of from 8 to 20 $m^2/g$.

Example: Sample 015 Cordierite Sintered Body

A powder mixture was made comprising powders of alumina, magnesia and silica combined in relative amounts to form a sintered body comprising phase pure crystalline cordierite. The alumina powder had a specific surface area (SSA) of from about 6.5 to 8.5 $m^2/g$, a particle size distribution having a d10 particle size of from about 0.07 to 0.09 μm, a d50 particle size of from about 0.15 to 0.25 μm and a d90 particle size of from about 0.5 to 1 μm, and a purity of 99.999% relative to an alumina powder having 100% purity. The powder of magnesia had a specific surface area of from about 5.5 to about 6.5 $m^2/g$, a particle size distribution having a d10 of from about 0.09 to about 0.2 um, a d50 of from about 1.0 to 2.5 um, a d90 of from about 18 to 28 um, and a purity of 99.99% relative to 100% pure magnesia. The silica preferably comprises a pyrogenic silica powder. Pyrogenic silica powder (or fumed silica powder), owing to its method of production (by flame pyrolysis of silicon-containing compounds such as silicon tetrachloride or sand for example) comprises substantially non spherical agglomerates or aggregates having very high aspect ratios, thus results using the Laser Scattering Particle Size Distribution methods as disclosed herein may not provide sufficient accuracy when measuring the fumed silica powder. As such, particle sizes as reported for the fumed silica powder as disclosed herein are as reported in the literature. The silica powder as disclosed herein may comprise a primary particle size (a primary particle may comprise a single particle or single crystallite) of about 100 nm, and a d50 of about 9 um. having a specific surface area of from about 28-32 m²/g, and a purity of greater than 99.999% relative to 100% purity silica. The powders were weighed and combined to create the powder mixture in a molar ratio to form the cordierite phase upon sintering. The powder mixture was then transferred to a container for tumble (vertical or end over end) milling. Ethanol in an amount of about 250% relative to powder weight was added to the powder mixture to form a slurry, and high purity (about 99.99% as measured using ICPMS methods) media at about 150% relative to powder weight was added to facilitate mixing of the powder mixture. After 20 hours of mixing at an RPM of about 20, the slurry containing the powder mixture was removed from the mixer and the ethanol was extracted from the slurry using rotary evaporation methods as known to those skilled in the art. Thereafter calcination was performed at 600° C. for 8 hours. The calcined powder mixture may be optionally sieved, tumbled, blended, etc. according to known methods after calcination. The powder mixture had a specific surface area (as measured in accordance with BET surface area measurements according to ASTM C1274) of from 18 to 20 m²/g, a particle size distribution (measured using a Horiba model LA-960 Laser Scattering Particle Size Distribution Analyzer as disclosed herein) having a d10 of from 0.10 to 0.25 um, a d50 of from 0.25 to 0.35 um, a d90 of from 65 to 75 um, and a purity of 99.9993 (as measured using an ICP-MS from Agilent 7900 ICP-MS model G8403). The calcined powder mixture was then sintered at a temperature of 1200° C., a pressure of 15 MPa for a duration of 30 minutes under vacuum in accordance with the method as disclosed herein. An average density across five measurements was measured (using the Archimedes method in accordance with ASTM B962-17) to be 2.573 g/cc or 96.73% of the theoretical density of cordierite (reported as 2.66 g/cc (D. R. Lide, CRC Handbook of Chemistry and Physics, CRC press (2012)). Correspondingly, a volumetric or bulk porosity of 3.27% is calculated from the density measurements. A combination of X-ray diffraction, SEM and image analysis (using ImageJ analysis software) methods as disclosed herein were performed on sample 015.

X ray diffraction confirmed the sintered body comprised cordierite in an amount of about 95% by volume, and an alumina rich sapphirine crystalline phase (denoted by "S" $(Mg, Al)_8(Al, Si)_6O_{20})$ in an amount of about 5% by volume as depicted in FIG. 7 and determined by peak intensity ratio comparisons as known to those skilled in the art.

In order to determine the phase purity to greater accuracy, for example up to and including about 98% accuracy, SEM images were taken using backscatter detection (BSD) methods as known to those skilled in the art. Using BSD, the cordierite phase appears light gray, aluminum oxide and/or alumina rich phases may appear black or dark gray, and porosity, if present, also appears black. Images were taken at 1000× using BSD methods as known to those skilled in the art to identify the crystalline phases and any porosity present as depicted in FIG. 8 (for sample 015). In order to differentiate between black regions comprising a sapphirine crystalline phase and those comprising porosity, the BSD image was black and white thresholded using ImageJ processing software to highlight dark or black regions which may comprise either porosity or a sapphirine crystalline phase. A total area of the surface comprising either porosity or the sapphirine crystalline phase was calculated.

Using the topographic mode of the BSD detector, topographic images (as depicted in FIG. 9) were taken across a surface of the cordierite sintered body. To identify regions or area comprising porosity, the topographic image was black and white thresholded using ImageJ processing software to highlight black regions in the image which may comprise porosity or surface defects. A total area of the surface comprising porosity was calculated from topographic imaging and subtracted from the total area of the surface comprising either porosity or the sapphirine crystalline phase to obtain both the percent of the surface comprising porosity and the percent of the surface comprising sapphirine. Using the topographic methods as disclosed, the at least one surface of the cordierite sintered body may comprise porosity in an amount of less than about 1%, preferably less than about 0.9%, preferably less than about 0.8%, preferably less than about 0.6%, preferably less than about 0.3%, preferably less than about 0.1%, preferably about 0.05% with respect to the total area of the at least one surface.

Using the topographic image of FIG. 9, image analysis measurements were performed on the cordierite sintered body according to the example. The cordierite sintered body was measured to comprise pores having a maximum pore size across a surface of 5 um and less (as depicted by feature 1 in FIG. 9). Features 2, 3 and 4 of FIG. 9 had pore diameters of 2 um, 2 um and 3 um respectively. Using SEM and ImageJ processing, a minimum pore size of about +/–0.1 um may be measured. Thus, the cordierite sintered body in accordance with this example has a surface comprising pores having a diameter of from 0.1 um to 5 um, preferably from 0.1 um to 4 um, 0.1 um to 3 um, 0.1 um to 2 um, 0.1 um to 1 um as measured using SEM images and ImageJ processing methods.

The surface of the cordierite sintered body was measured using XRD, SEM and ImageJ methods to comprise from about 2% to about 5% of the sapphirine phase, thus disclosed herein is a cordierite sintered body comprising from about 95 to 98% of the cordierite phase, and from about 2 to 5% of the sapphirine phase.

A number of embodiments have been disclosed herein. Nevertheless, it will be understood that various modifications may be made without departing from the spirit and scope of the embodiments as disclosed herein. Accordingly, other embodiments are within the scope of the following claims.

What is claimed is:

1. A cordierite sintered body comprising: wherein the cordierite sintered body has at least one surface comprising pores having a diameter of from 0.1 to 5 um as measured using SEM and image processing methods, wherein the cordierite sintered body comprises a cordierite crystal phase in an amount by volume of from about 95% to about 98% and a sapphirine crystal phase in an amount of from about 2% to about 5% measured using x ray diffraction, SEM and image processing methods, and the cordierite sintered body having a Young's modulus of from 125 to 140 GPa, as measured in accordance with ASTM E1876-15.

2. The cordierite sintered body of claim 1, wherein the at least one surface comprises pores having a diameter of from 0.1 to 4 um.

3. The cordierite sintered body of claim 1 having a density of from 2.55 to 2.63 g/cc.

4. The cordierite sintered body of claim 1 having a volumetric porosity of from 0.1 to 4%, as calculated from density measurements performed in accordance with ASTM B962-17.

5. The cordierite sintered body of claim 1 wherein the cordierite sintered body is substantially crystalline as determined by x ray diffraction.

6. The cordierite sintered body of claim 1 having an arithmetical mean height (Sa) of 75 nm and less, on a surface as measured in accordance with ISO standard 25178-2-2012.

7. The cordierite sintered body of claim 1 having a maximum height (Sz) of less than 5.5 um, according to ISO standard 25178-2-2012.

8. The cordierite sintered body of claim 1 having a purity of from 99.9 to 99.995%, of the cordierite sintered body as measured using ICPMS methods.

9. A photolithographic reticle comprising at least one layer of the cordierite sintered body according to claim 1.

10. The cordierite sintered body of claim 1, wherein each of the powders, powder mixture and calcined powder mixture are free of naturally occurring materials comprising talc, kaolin, gibsite, dolomite, sepiolite, forsterite, and other clays and clay-based compounds.

11. The cordierite sintered body of claim 1, wherein the cordierite sintered body is free of naturally occurring materials comprising talc, kaolin, gibsite, dolomite, sepiolite, forsterite, and other clays and clay-based compounds.

12. The cordierite sintered body of claim 1, wherein the cordierite sintered body is free of glass forming constituents comprising alkali metal elements including lithium (Li), sodium (Na) and potassium (K), alkaline earth metal elements including calcium (Ca), strontium (Sr) and barium (Ba), transition metals including chromium (Cr), nickel (Ni), iron (Fe), copper (Cu), zinc (Zn), lead (Pb), rubidium (Rb) and metalloid elements including boron (B), germanium (Ge), arsenic (As), antimony (Sb) and bismuth (Bi).

13. The cordierite sintered body of claim 1, wherein the at least one surface comprises pores having a diameter of from 0.1 to 1 um.

14. The cordierite sintered body of claim 1 having a density of from 2.62 to 2.63 g/cc, as measured in accordance with ASTM B962-17.

15. The cordierite sintered body of claim 1 having a volumetric porosity of from 1.5 to 3.5% as calculated from density measurements performed in accordance with ASTM B962-17.

16. The cordierite sintered body of claim 1 having an arithmetical mean height (Sa) of from 2 to 5 nm on a surface as measured in accordance with ISO standard 25178-2-2012.

17. The cordierite sintered body of claim 1 having a maximum height (Sz) of from 0.3 to 1 um, according to ISO standard 25178-2-2012.

18. The cordierite sintered body of claim 1 having a purity of from 99.95 to 99.995% relative to 100% purity of the cordierite sintered body as measured using ICPMS methods.

\* \* \* \* \*